(12) United States Patent
Okano

(10) Patent No.: US 11,380,804 B2
(45) Date of Patent: Jul. 5, 2022

(54) SEMICONDUCTOR DEVICE WITH HIGHER BREAKDOWN VOLTAGE AND ELECTRONIC APPARATUS

(71) Applicant: SONY SEMICONDUCTOR SOLUTIONS CORPORATION, Kanagawa (JP)

(72) Inventor: Hitoshi Okano, Kanagawa (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 127 days.

(21) Appl. No.: 16/640,504

(22) PCT Filed: Jul. 13, 2018

(86) PCT No.: PCT/JP2018/026529
§ 371 (c)(1),
(2) Date: Feb. 20, 2020

(87) PCT Pub. No.: WO2019/044209
PCT Pub. Date: Mar. 7, 2019

(65) Prior Publication Data
US 2020/0357933 A1 Nov. 12, 2020

(30) Foreign Application Priority Data
Aug. 30, 2017 (JP) .............................. JP2017-165619

(51) Int. Cl.
*H01L 29/868* (2006.01)
*H01L 27/02* (2006.01)
*H01L 29/06* (2006.01)

(52) U.S. Cl.
CPC ........ *H01L 29/868* (2013.01); *H01L 27/0255* (2013.01); *H01L 29/0615* (2013.01); *H01L 29/0657* (2013.01)

(58) Field of Classification Search
None
See application file for complete search history.

(56) References Cited

U.S. PATENT DOCUMENTS 5,144,406 A * 9/1992 Hemings ............... H01L 29/868
257/E23.122
7,608,867 B2 * 10/2009 Charbuillet ........... H01L 29/868
257/302

(Continued)

FOREIGN PATENT DOCUMENTS

JP 11-251597 A 9/1999
JP 2006-227445 A 8/2006

(Continued)

OTHER PUBLICATIONS

International Search Report and Written Opinion of PCT Application No. PCT/JP2018/026529, dated Sep. 18, 2018, 11 pages of ISRWO.

*Primary Examiner* — Bilkis Jahan
(74) *Attorney, Agent, or Firm* — Chip Law Group

(57) ABSTRACT

A semiconductor device including a first conductivity-type layer into which first conductivity-type impurities are introduced, a second conductivity-type layer into which second conductivity-type impurities are introduced, the second conductivity-type impurities being different in polarity from the first conductivity-type impurities, and an intermediate layer that is sandwiched between the first conductivity-type layer and the second conductivity-type layer, and does not include the first conductivity-type impurities or the second conductivity-type impurities, or includes the first conductivity-type impurities or the second conductivity-type impurities at a concentration lower than a concentration of the first conductivity-type impurities in the first conductivity-type layer or the second conductivity-type impurities in the second conductivity-type layer, the first conductivity-type layer, the (Continued)

intermediate layer, and the second conductivity-type layer being stacked in a thickness direction of a semiconductor substrate inside the semiconductor substrate.

6 Claims, 15 Drawing Sheets

(56) References Cited

U.S. PATENT DOCUMENTS

| | | | | |
|---|---|---|---|---|
| 2008/0197360 A1* | 8/2008 | Sriram | ................ | H01L 29/1608 |
| | | | | 257/E29.022 |
| 2010/0019291 A1* | 1/2010 | Mouli | ................... | H01L 29/808 |
| | | | | 257/E21.445 |
| 2010/0208517 A1* | 8/2010 | Lo | ............................ | G11C 5/04 |
| | | | | 257/656 |
| 2011/0024807 A1 | 2/2011 | Katayama | | |
| 2016/0148959 A1* | 5/2016 | Cheng | ................... | H01L 31/028 |
| | | | | 257/290 |
| 2019/0371853 A1* | 12/2019 | Von Kanel | ............ | H01L 23/544 |

FOREIGN PATENT DOCUMENTS

| | | |
|---|---|---|
| JP | 2007-141937 A | 6/2007 |
| JP | 2011-009466 A | 1/2011 |
| JP | 2011-035095 A | 2/2011 |

* cited by examiner

[ FIG. 1 ]
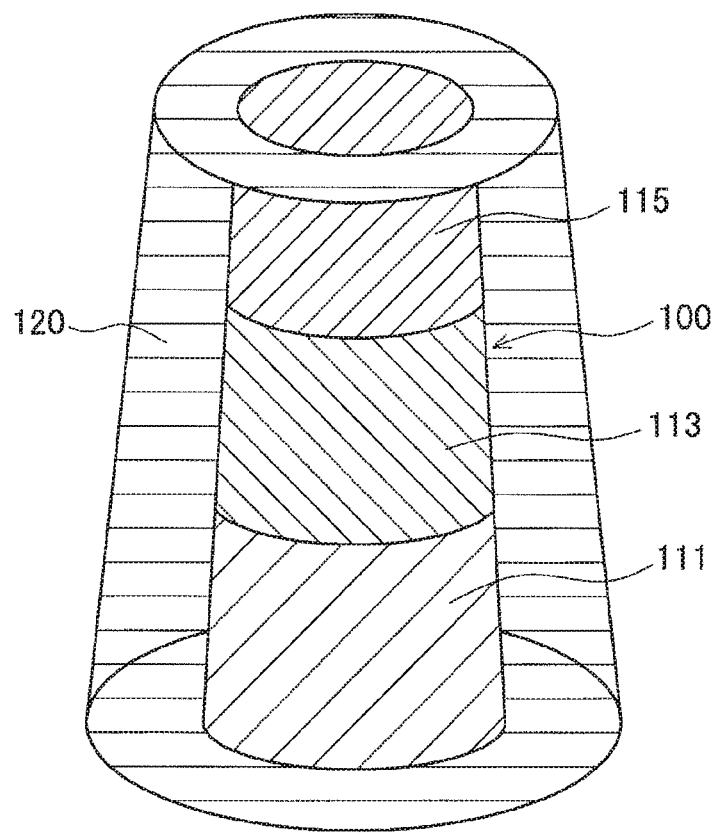

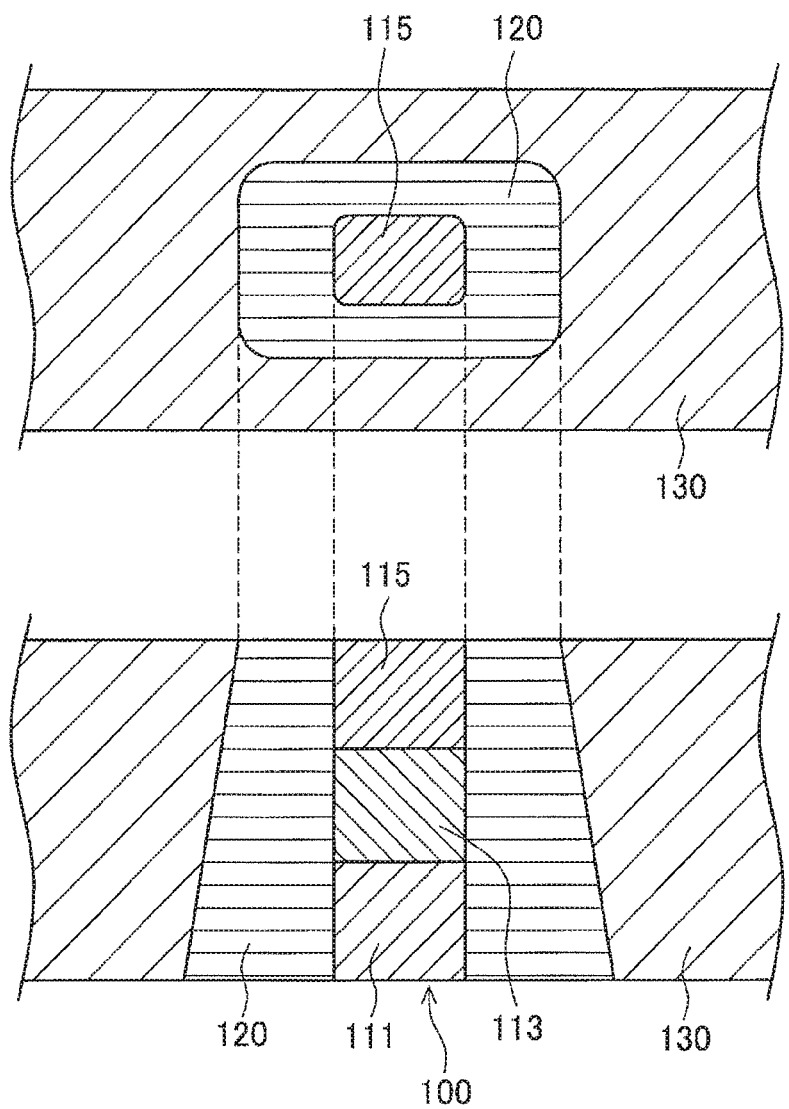
[FIG. 2]

[FIG. 3A]
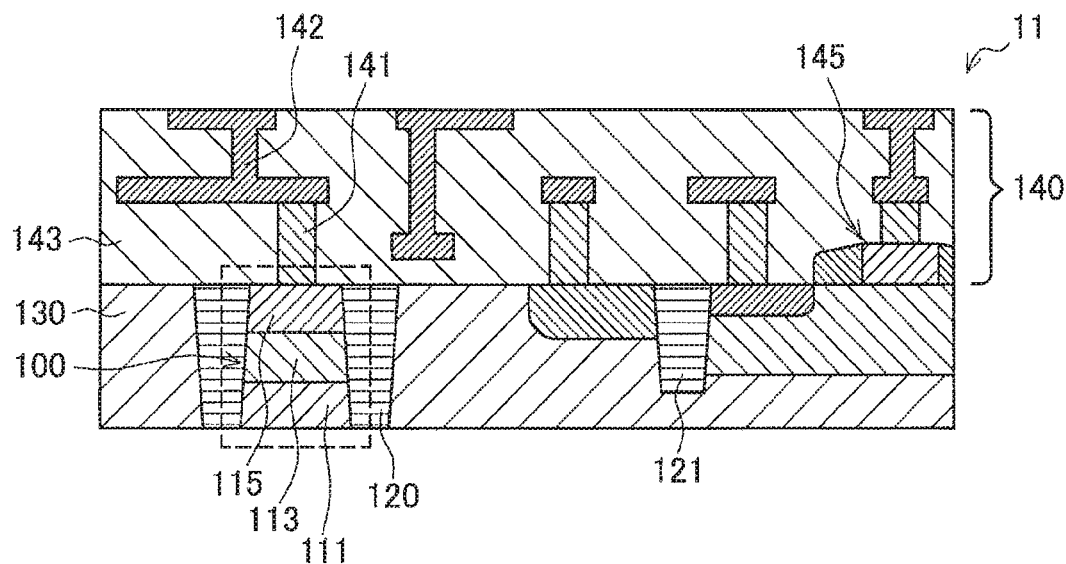
[FIG. 3B]
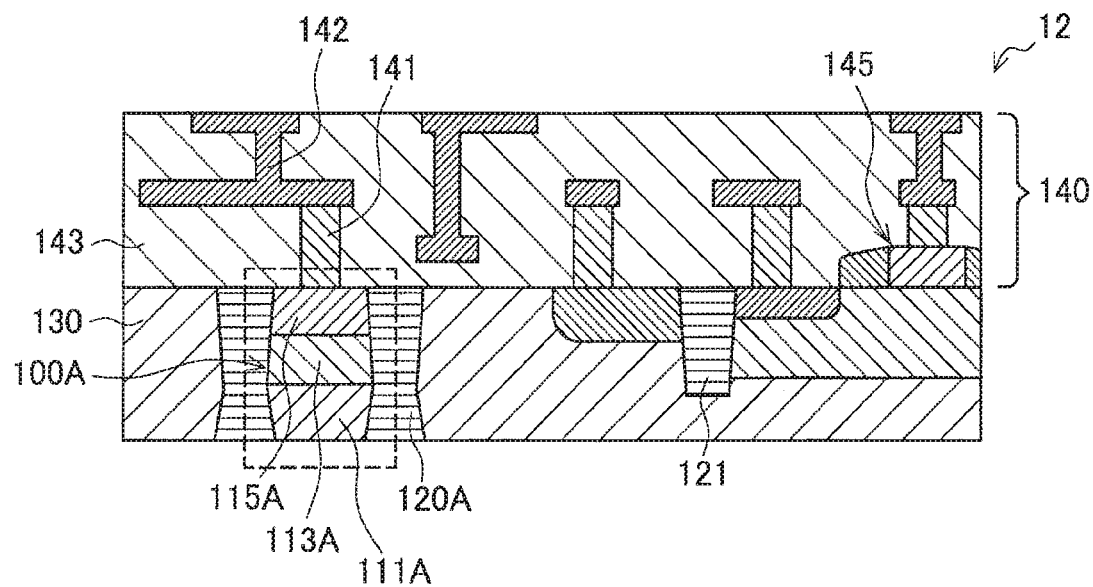

[ FIG. 3C ]
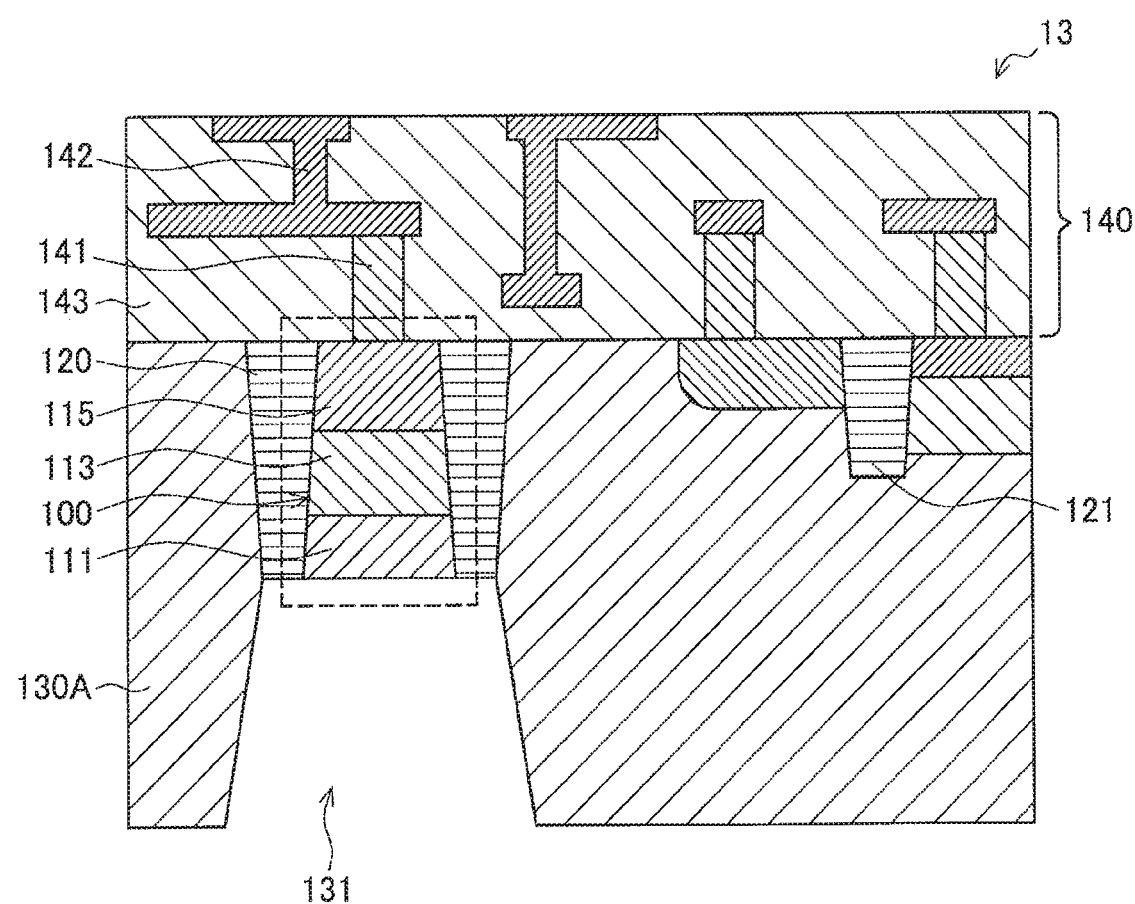

[FIG. 4A]
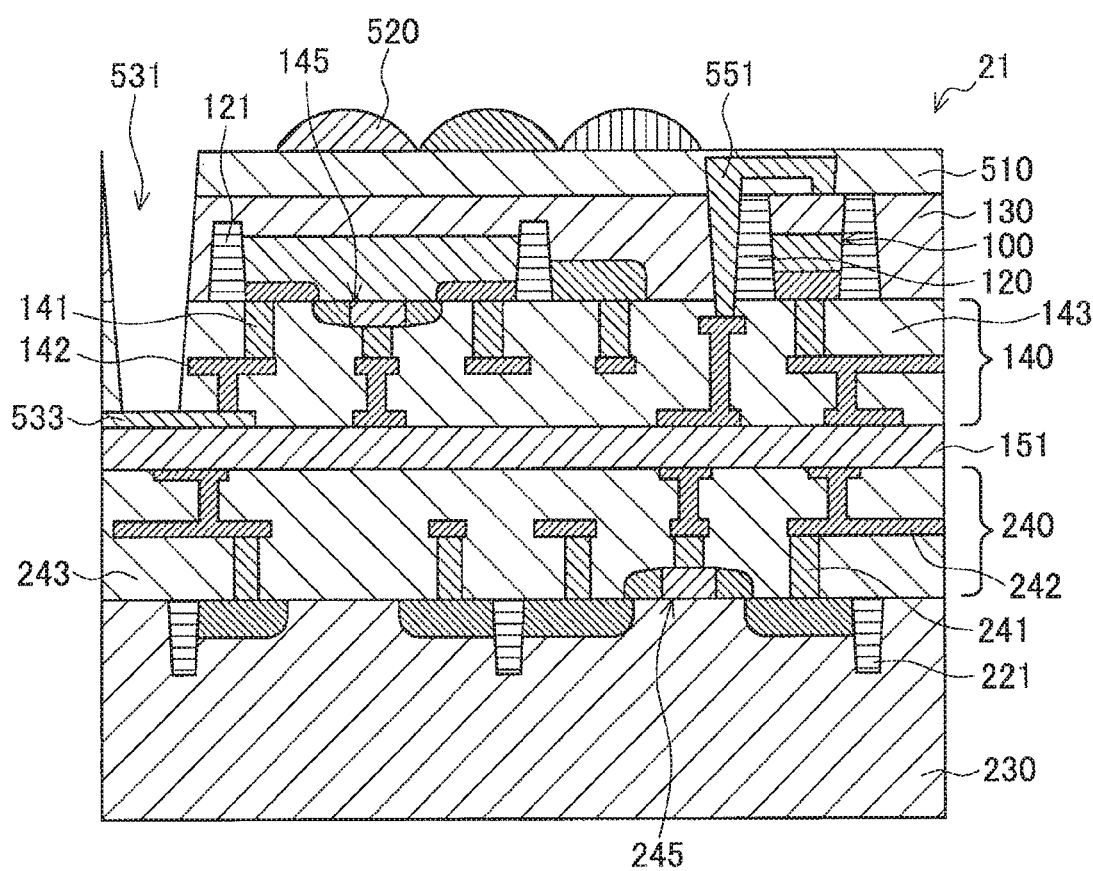

[FIG. 4B]
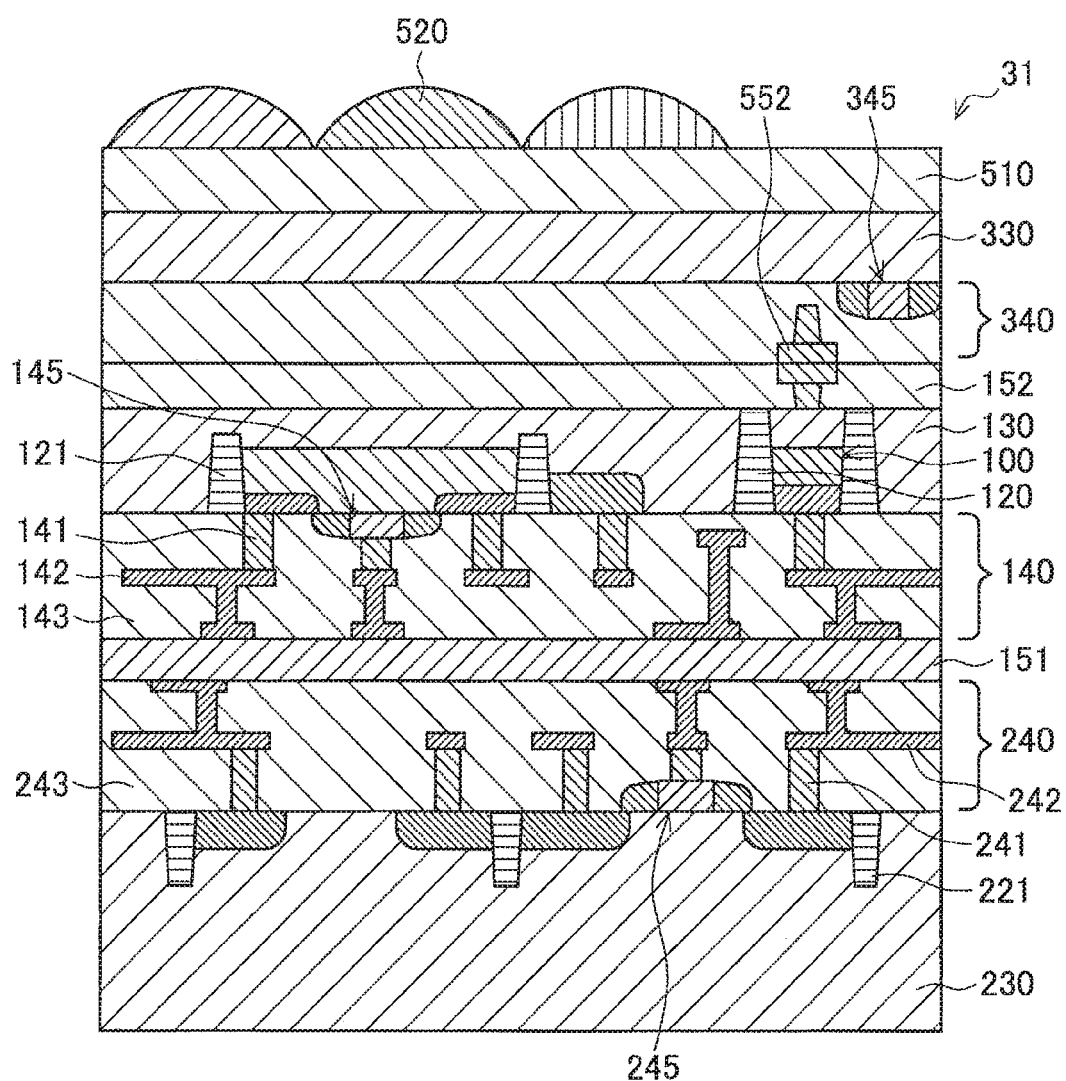

[ FIG. 4C ]
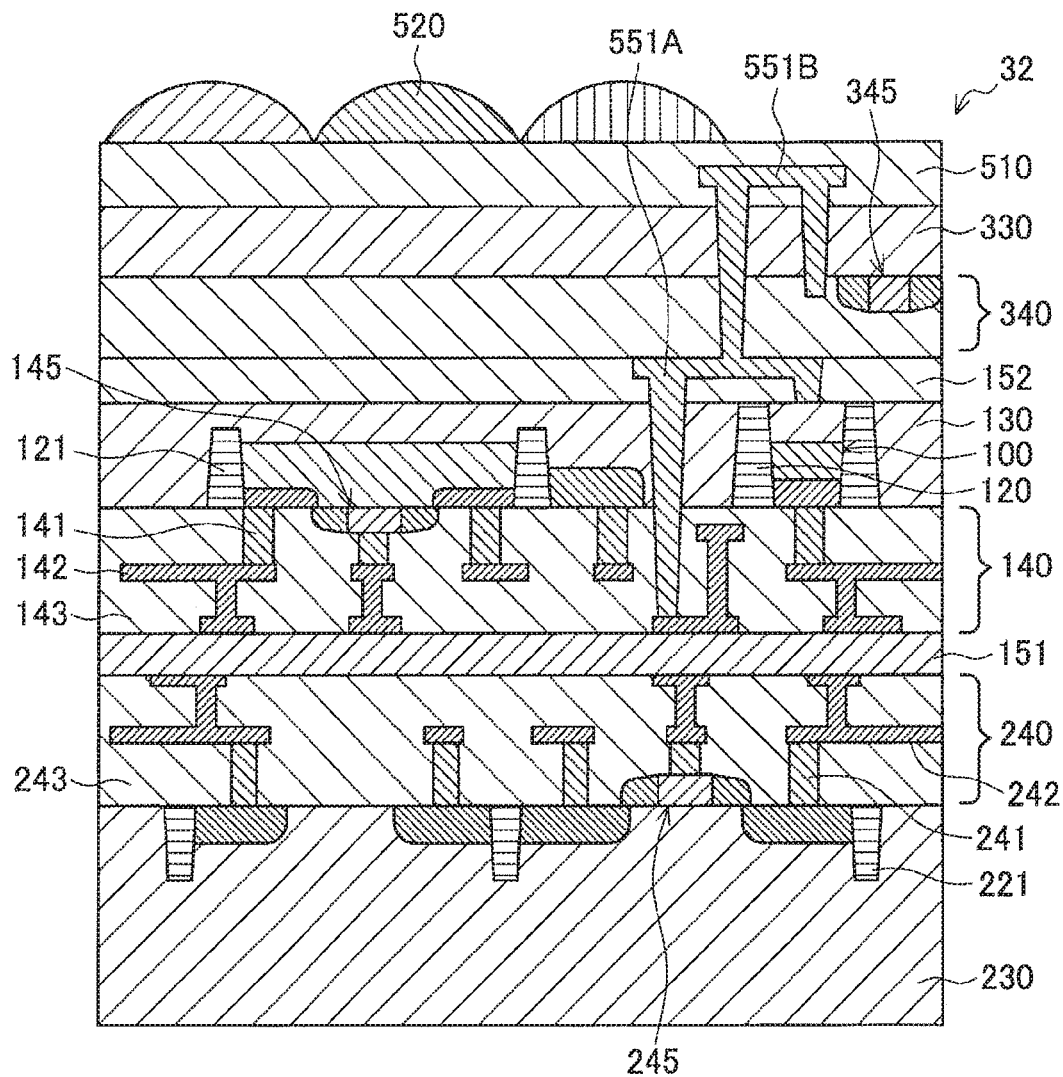
[ FIG. 5A ]
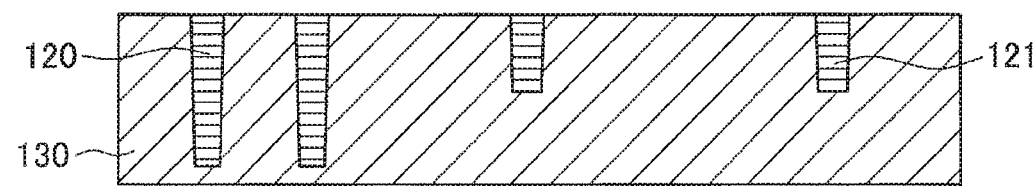
[ FIG. 5B ]
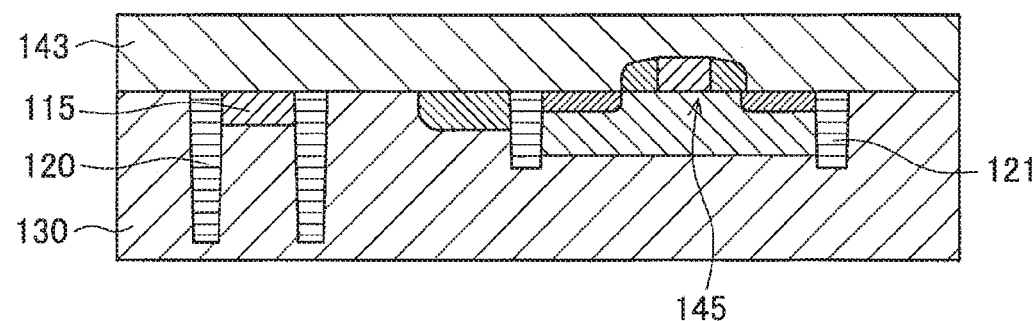

[ FIG. 5C ]
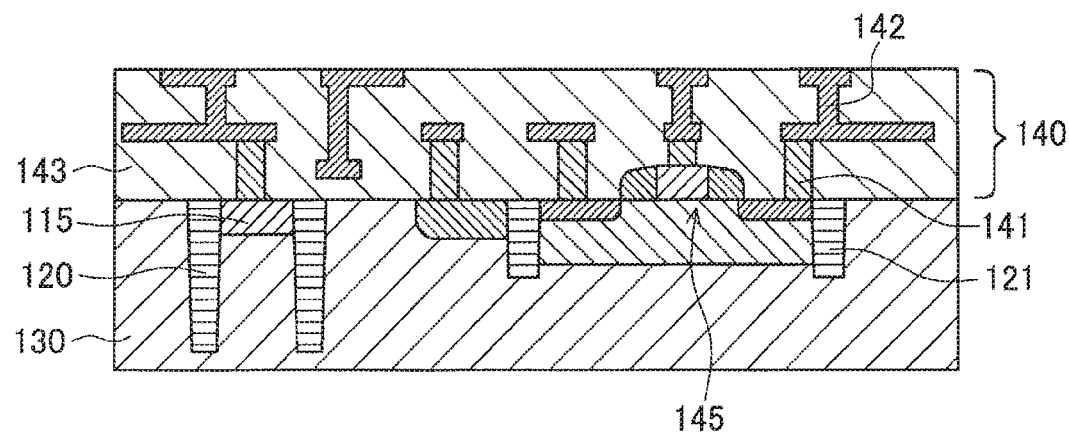
[ FIG. 5D ]
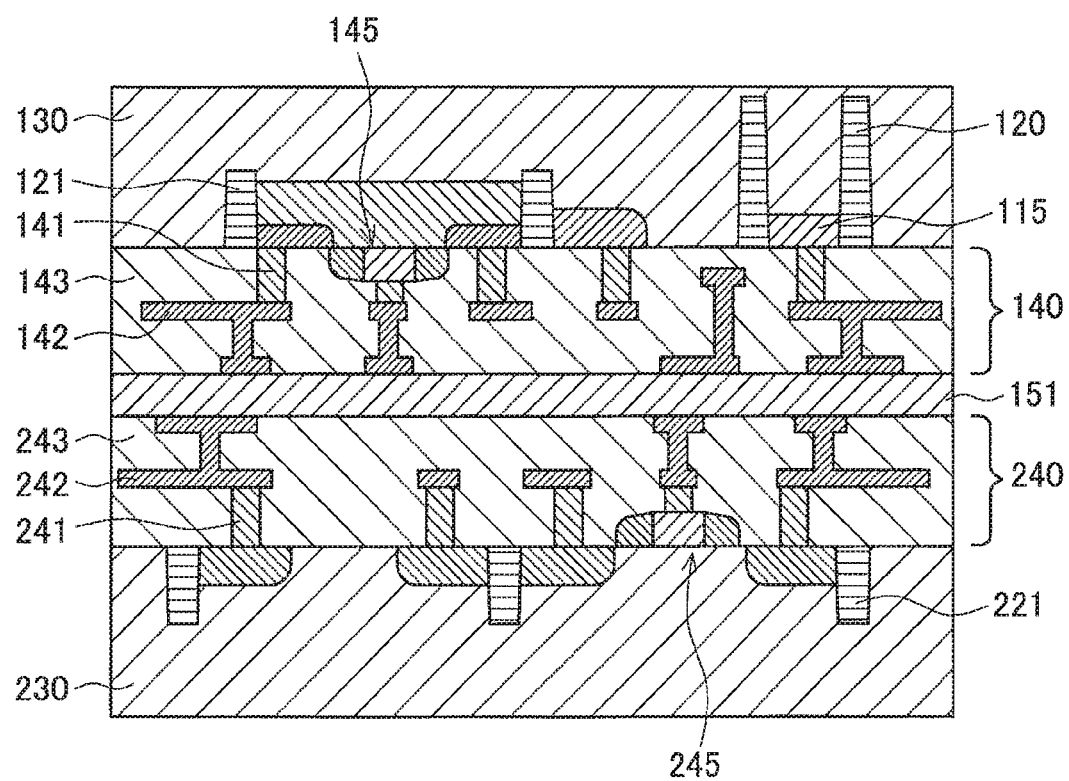

[FIG. 5E]
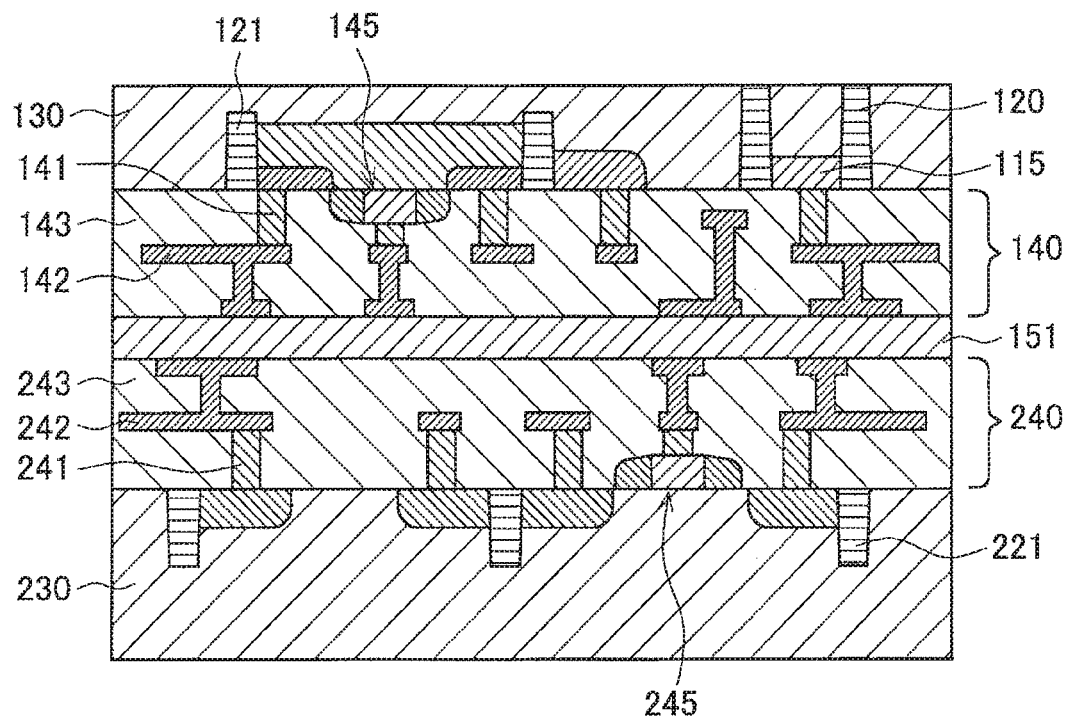
[FIG. 5F]
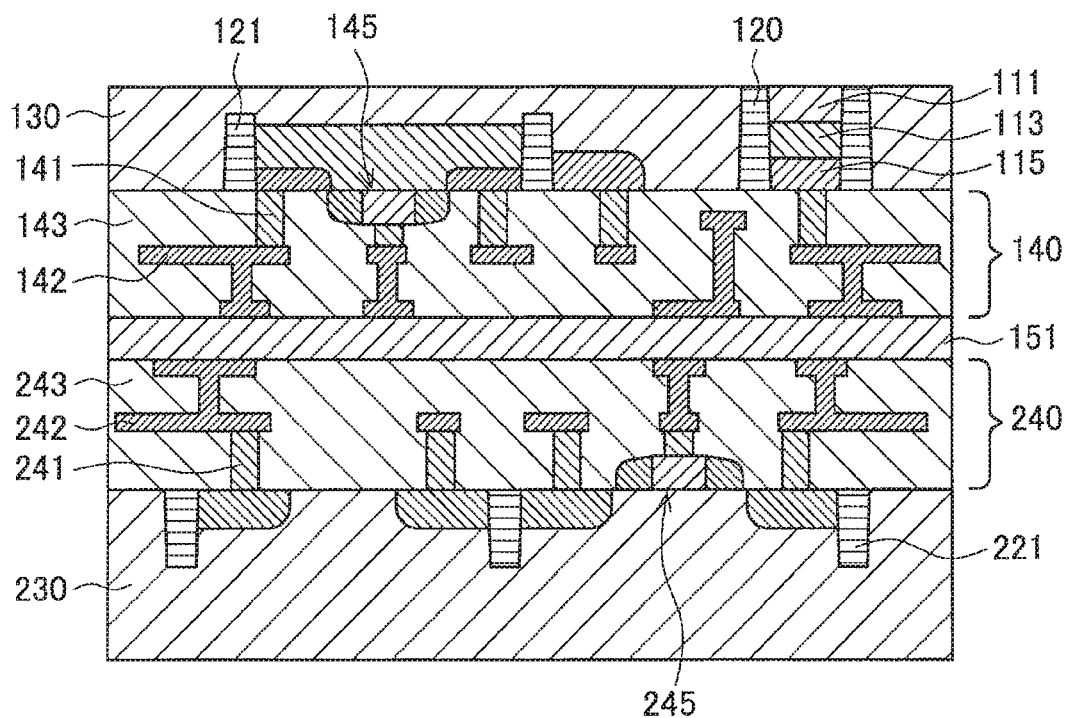

[ FIG. 6A ]
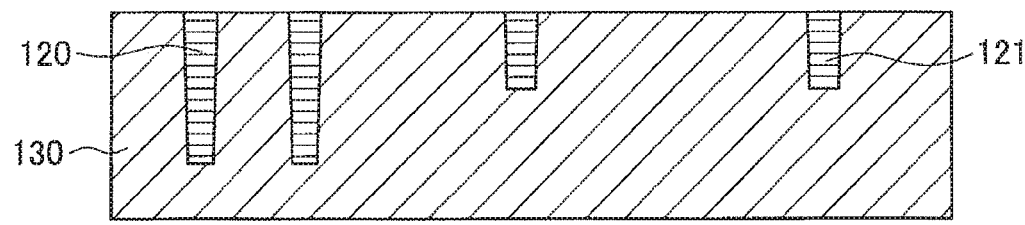
[ FIG. 6B ]
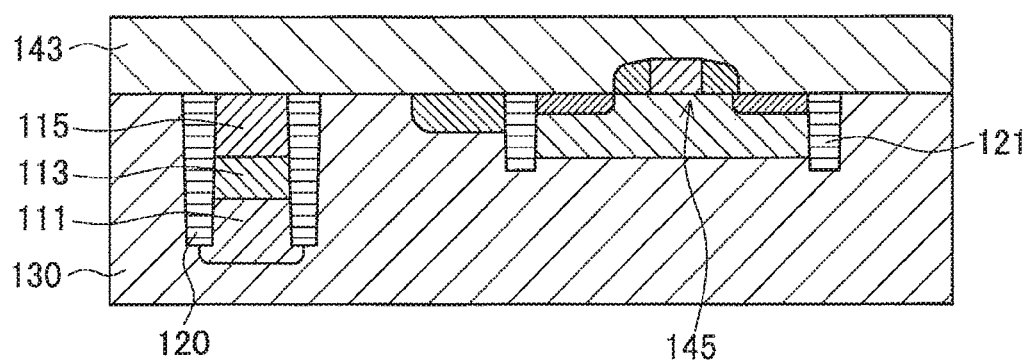
[ FIG. 6C ]
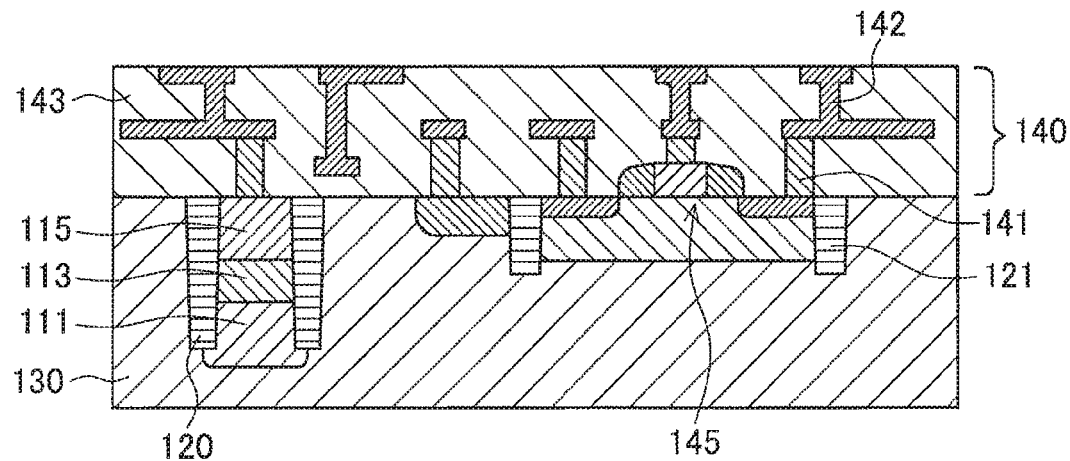

[FIG. 6D]
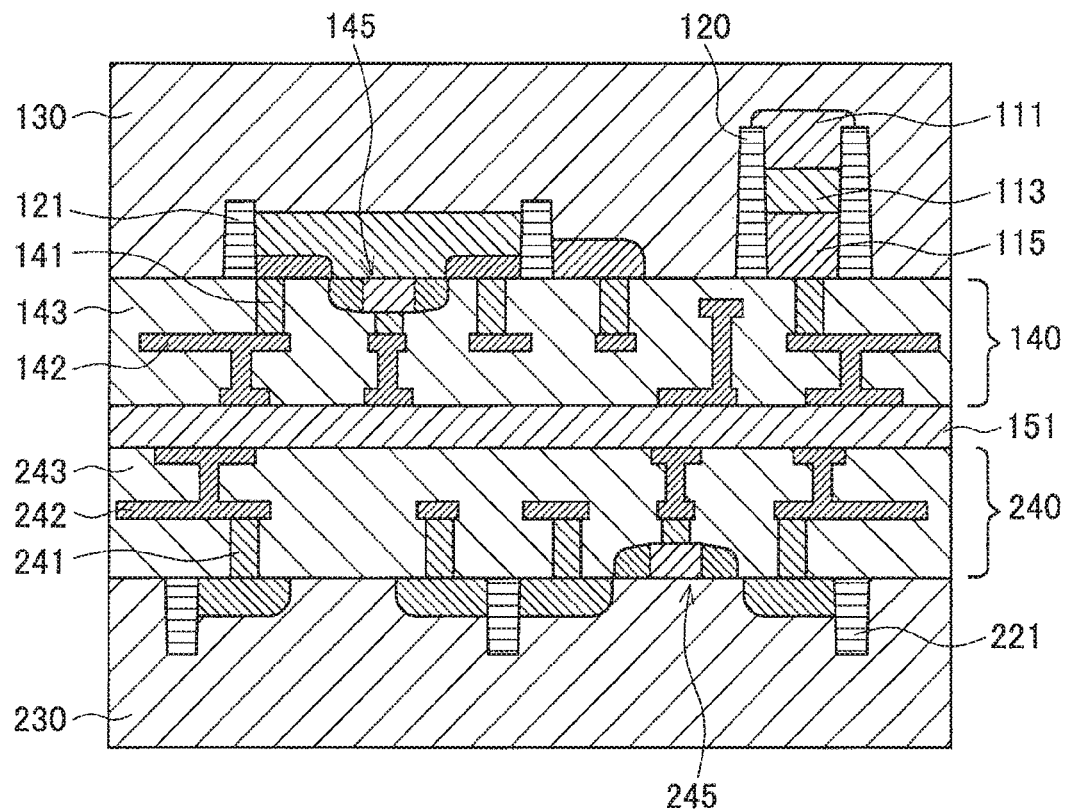
[FIG. 6E]
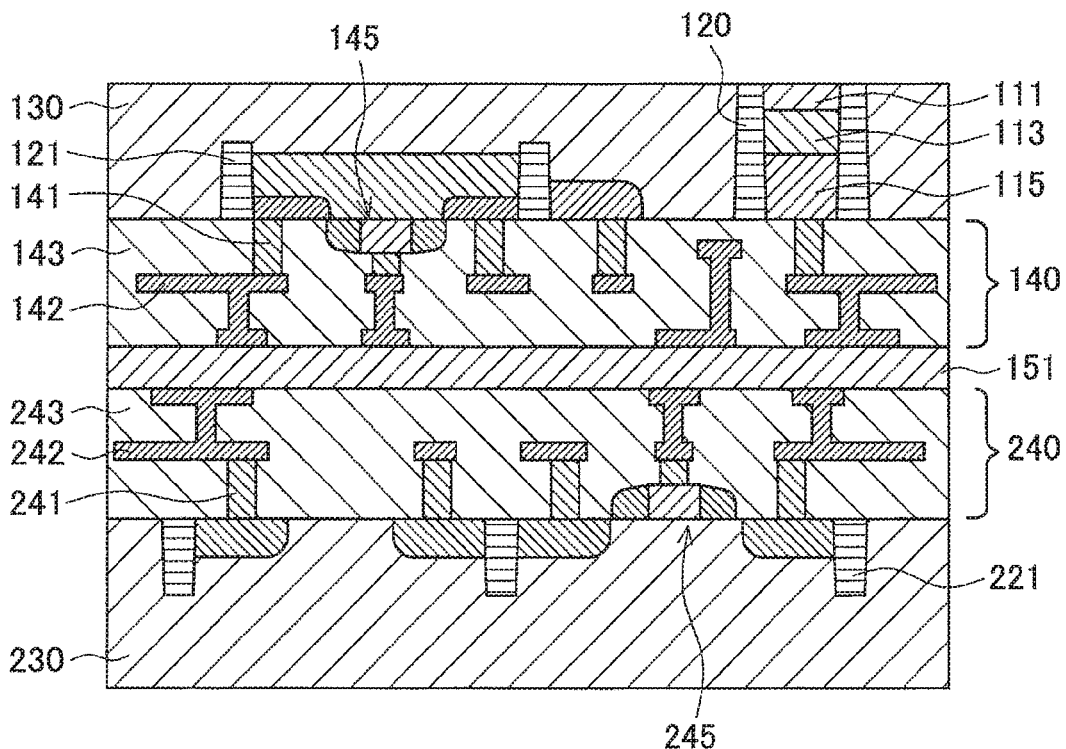

[ FIG. 7A ]
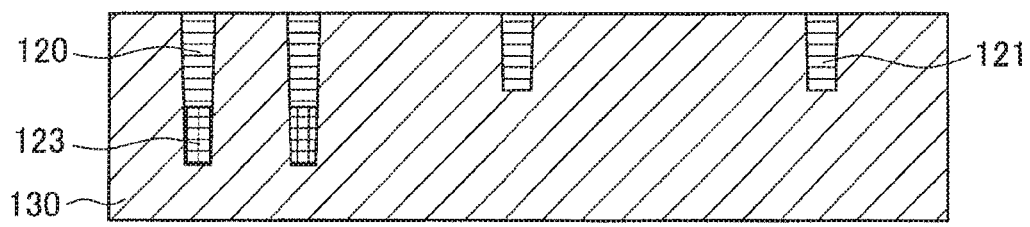
[ FIG. 7B ]
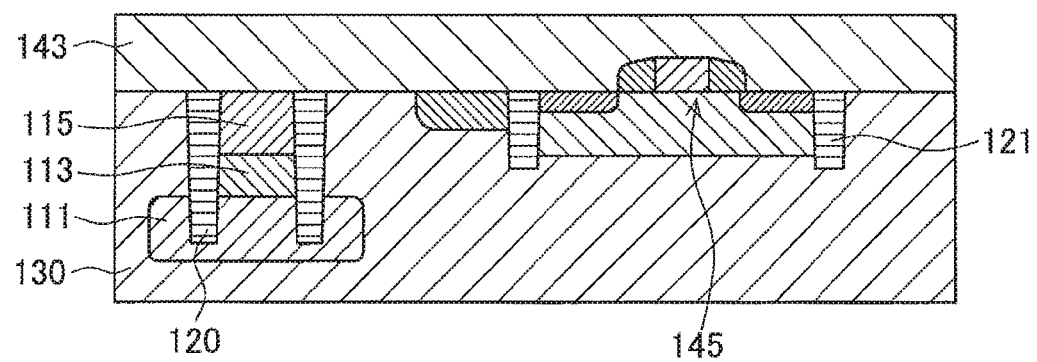
[ FIG. 7C ]
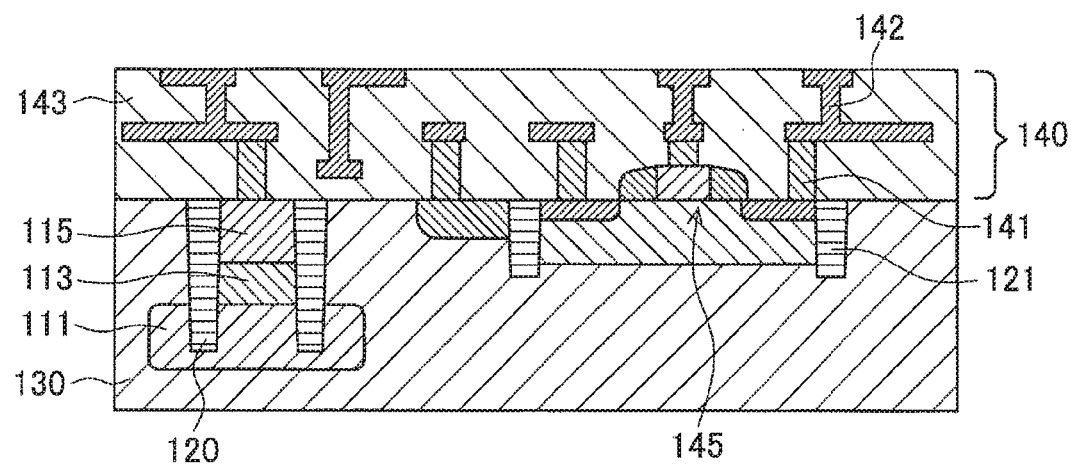

[ FIG. 7D ]
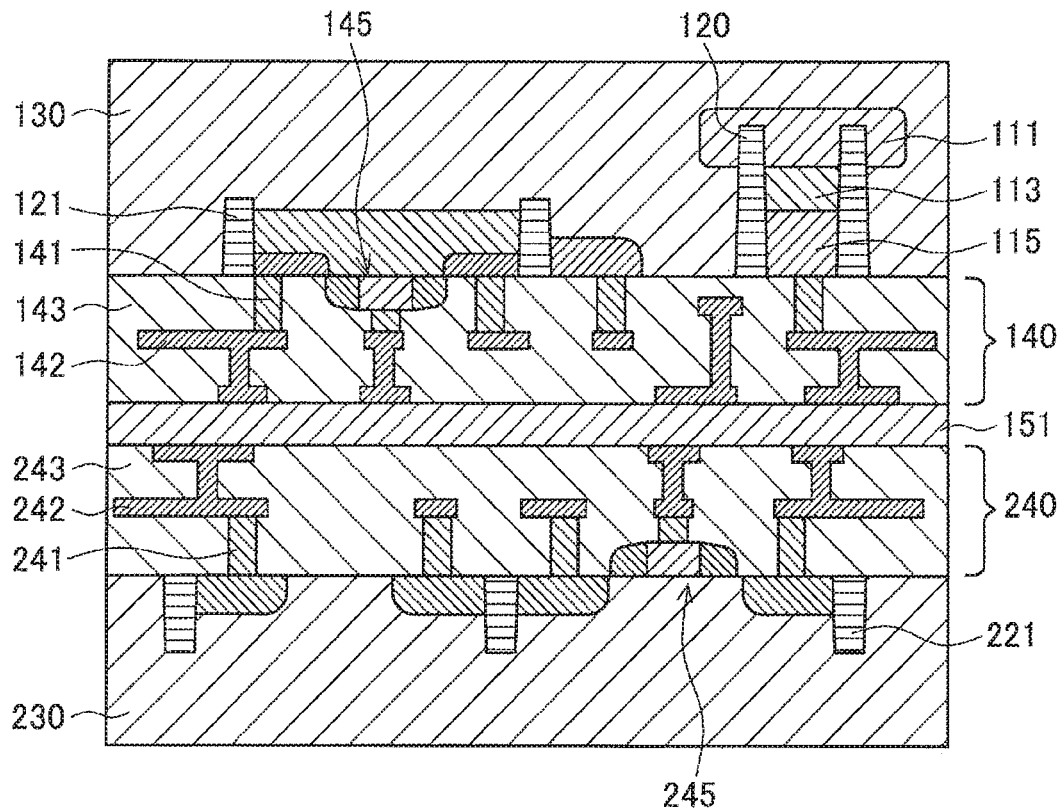
[ FIG. 7E ]
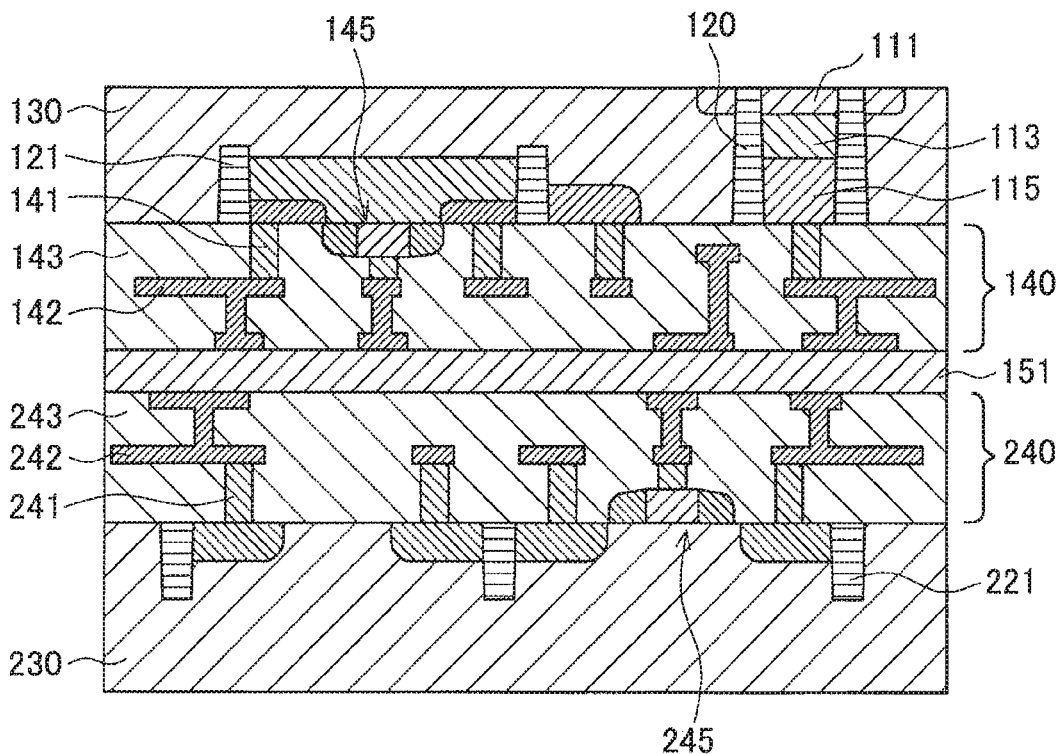

[ FIG. 8A ]
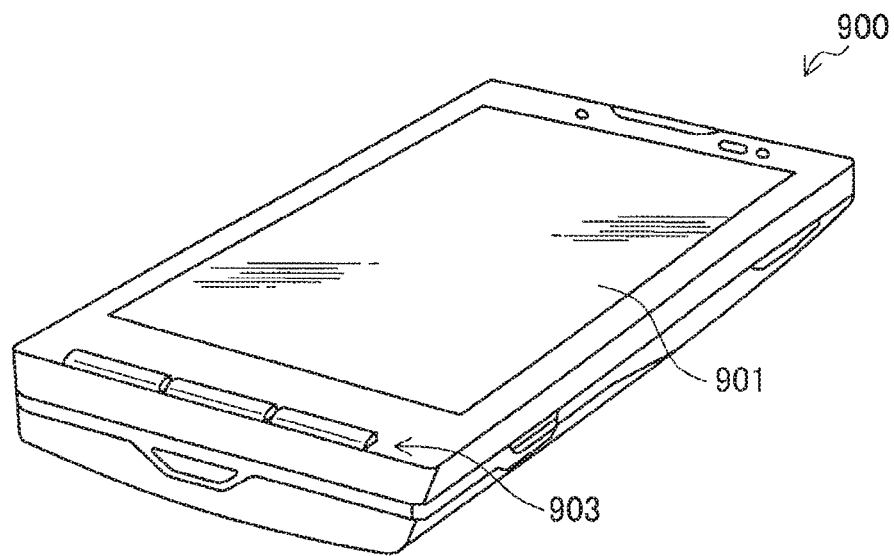
[ FIG. 8B ]
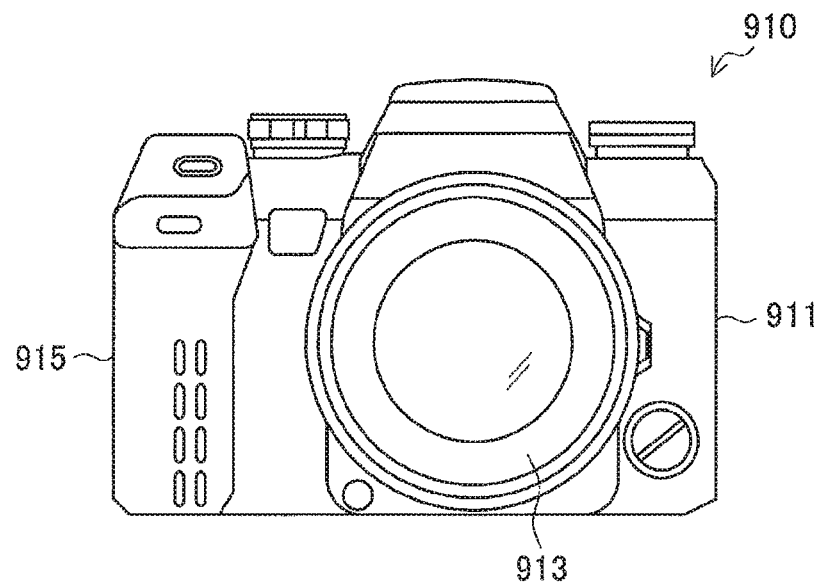

[ FIG. 8C ]
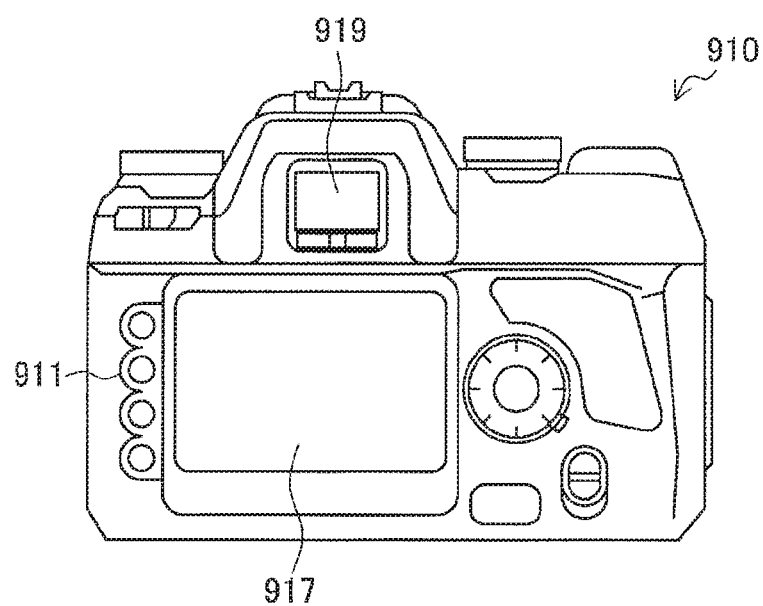

SEMICONDUCTOR DEVICE WITH HIGHER BREAKDOWN VOLTAGE AND ELECTRONIC APPARATUS

CROSS REFERENCE TO RELATED APPLICATIONS

This application is a U.S. National Phase of International Patent Application No. PCT/JP2018/026529 filed on Jul. 13, 2018, which claims priority benefit of Japanese Patent Application No. JP 2017-165619 filed in the Japan Patent Office on Aug. 30, 2017. Each of the above-referenced applications is hereby incorporated herein by reference in its entirety.

TECHNICAL FIELD

The present disclosure relates to a semiconductor device and an electronic apparatus.

BACKGROUND ART

In recent years, in semiconductor devices to be used in the IoT (Internet of Things) field and the automotive field, voltages of power supplies have become higher. Therefore, in such semiconductor devices, it is desired to withstand a higher surge voltage for a withstand voltage element that is provided in an input/output section (called also an I/O section) or the like to protect an internal circuit.

For example, as a typical withstand voltage element, a PN-junction diode in which a P-type semiconductor and an N-type semiconductor are joined is known. However, the PN-junction diode has a low breakdown voltage, which causes a difficulty in application to the withstand voltage element that is desired to have high withstand voltage performance as described above.

Here, as the withstand voltage element having high withstand voltage performance, for example, as disclosed in the following PTL 1, a diode having a PIN (P-Intrinsic-N) structure is proposed. In the PIN structure, a P-type semiconductor and an N-type semiconductor are joined with a low-dose intermediate layer interposed therebetween. In the diode having the PIN structure, a depletion layer is formed between the low-dose intermediate layer and each of the P-type semiconductor and the N-type semiconductor; therefore, an electric field between the P-type semiconductor and the N-type semiconductor is relaxed by the formed depletion layer. This allows the diode having the PIN structure to achieve a higher breakdown voltage than the PN-junction diode, which makes it possible to apply the diode having the PIN structure to the withstand voltage element having higher withstand voltage performance.

CITATION LIST

Patent Literature

PTL 1: Japanese Unexamined Patent Application Publication No. H11-251597

SUMMARY OF THE INVENTION

Problems to be Solved by the Invention

However, in the withstand voltage element disclosed in PTL 1, the PIN structure is formed in an in-plane direction of a semiconductor substrate, which causes an occupancy area of the withstand voltage element to become large. Accordingly, the withstand voltage element is not suitable for microfabrication of a semiconductor device. In particular, in a case where the withstand voltage element is provided for each input/output section, the withstand voltage element having a large occupancy area places a constraint on reduction in chip size of a semiconductor device.

Further, to make a breakdown voltage higher in the diode having the PIN structure, it is necessary to further increase a width of the depletion layer that is formed between the P-type semiconductor and the N-type semiconductor. Accordingly, the withstand voltage element that is desired to have higher withstand voltage performance has a larger occupancy area, which has raised a possibility of an increase in size of a semiconductor device.

Accordingly, a semiconductor device has been desired that is allowed to withstand a higher voltage while having a more efficient occupancy area.

Means for Solving the Problems

According to the present disclosure, there is provided a semiconductor device including: a first conductivity-type layer into which first conductivity-type impurities are introduced; a second conductivity-type layer into which second conductivity-type impurities are introduced, the second conductivity-type impurities being different in polarity from the first conductivity-type impurities; and an intermediate layer that is sandwiched between the first conductivity-type layer and the second conductivity-type layer, and does not include the first conductivity-type impurities or the second conductivity-type impurities, or includes the first conductivity-type impurities or the second conductivity-type impurities at a concentration lower than a concentration of the first conductivity-type impurities in the first conductivity-type layer or the second conductivity-type impurities in the second conductivity-type layer, the first conductivity-type layer, the intermediate layer, and the second conductivity-type layer being stacked in a thickness direction of a semiconductor substrate inside the semiconductor substrate.

Further, according to the present disclosure, there is provided an electronic apparatus provided with a semiconductor device that is provided inside a semiconductor substrate, the semiconductor device including: a first conductivity-type layer into which first conductivity-type impurities are introduced; a second conductivity-type layer into which second conductivity-type impurities are introduced, the second conductivity-type impurities being different in polarity from the first conductivity-type impurities; and an intermediate layer that is sandwiched between the first conductivity-type layer and the second conductivity-type layer, and does not include the first conductivity-type impurities or the second conductivity-type impurities, or includes the first conductivity-type impurities or the second conductivity-type impurities at a concentration lower than a concentration of the first conductivity-type impurities in the first conductivity-type layer or the second conductivity-type impurities in the second conductivity-type layer, the first conductivity-type layer, the intermediate layer, and the second conductivity-type layer being stacked in a thickness direction of a semiconductor substrate inside the semiconductor substrate.

According to the present disclosure, it is possible to form a PIN structure that includes, in a stacking direction, the first conductivity-type layer including the first conductivity-type impurities, the intermediate layer that does not include conductivity-type impurities or includes the conductivity-type impurities at a low concentration, and the second conductivity-type layer including the second conductivity-type impurities.

Effects of the Invention

As described above, according to the present disclosure, it is possible to provide a semiconductor device that is allowed to withstand a higher voltage while having a more efficient occupancy area.

It is to be noted that the above-described effects are not necessarily limitative. Any of the effects indicated in this description or other effects that may be understood from this description may be exerted in addition to the above-described effects or in place of the above-described effects.

BRIEF DESCRIPTION OF DRAWINGS

FIG. 1 is a perspective view for describing a configuration of a semiconductor device according to an embodiment of the present disclosure.

FIG. 2 is a top view and a cross-sectional view for describing the configuration of the semiconductor device according to the embodiment.

FIG. 3A is a cross-sectional view of an example in which the semiconductor device according to the embodiment is applied to a single-layer semiconductor device.

FIG. 3B is a cross-sectional view of another example in which the semiconductor device according to the embodiment is applied to the single-layer semiconductor device.

FIG. 3C is a cross-sectional view of still another example in which the semiconductor device according to the embodiment is applied to the single-layer semiconductor device.

FIG. 4A is a cross-sectional view of an example in which the semiconductor device according to the embodiment is applied to a multi-layer semiconductor device.

FIG. 4B is a cross-sectional view of another example in which the semiconductor device according to the embodiment is applied to the multi-layer semiconductor device.

FIG. 4C is a cross-sectional view of still another example in which the semiconductor device according to the embodiment is applied to the multi-layer semiconductor device.

FIG. 5A is a longitudinal cross-sectional view for schematically describing a process of a first method of manufacturing the multi-layer semiconductor device.

FIG. 5B is a longitudinal cross-sectional view for schematically describing a process of the first method of manufacturing the multi-layer semiconductor device.

FIG. 5C is a longitudinal cross-sectional view for schematically describing a process of the first method of manufacturing the multi-layer semiconductor device.

FIG. 5D is a longitudinal cross-sectional view for schematically describing a process of the first method of manufacturing the multi-layer semiconductor device.

FIG. 5E is a longitudinal cross-sectional view for schematically describing a process of the first method of manufacturing the multi-layer semiconductor device.

FIG. 5F is a longitudinal cross-sectional view for schematically describing a process of the first method of manufacturing the multi-layer semiconductor device.

FIG. 6A is a longitudinal cross-sectional view for schematically describing a process of a second method of manufacturing the multi-layer semiconductor device.

FIG. 6B is a longitudinal cross-sectional view for schematically describing a process of the second method of manufacturing the multi-layer semiconductor device.

FIG. 6C is a longitudinal cross-sectional view for schematically describing a process of the second method of manufacturing the multi-layer semiconductor device.

FIG. 6D is a longitudinal cross-sectional view for schematically describing a process of the second method of manufacturing the multi-layer semiconductor device.

FIG. 6E is a longitudinal cross-sectional view for schematically describing a process of the second method of manufacturing the multi-layer semiconductor device.

FIG. 7A is a longitudinal cross-sectional view for schematically describing a process of a third method of manufacturing the multi-layer semiconductor device.

FIG. 7B is a longitudinal cross-sectional view for schematically describing a process of the third method of manufacturing the multi-layer semiconductor device.

FIG. 7C is a longitudinal cross-sectional view for schematically describing a process of the third method of manufacturing the multi-layer semiconductor device.

FIG. 7D is a longitudinal cross-sectional view for schematically describing a process of the third method of manufacturing the multi-layer semiconductor device.

FIG. 7E is a longitudinal cross-sectional view for schematically describing a process of the third method of manufacturing the multi-layer semiconductor device.

FIG. 8A is an external view of an example of an electronic apparatus according to an embodiment of the present disclosure.

FIG. 8B is an external view of another example of the electronic apparatus according to the embodiment.

FIG. 8C is an external view of still another example of the electronic apparatus according to the embodiment.

MODES FOR CARRYING OUT THE INVENTION

Hereinafter, preferred embodiments of the present disclosure will be described in detail with reference to the attached drawings. It is to be noted that, in the present specification and drawings, component parts having substantially the same functional configurations are denoted with the same reference numerals, and description thereof is not repeated.

It is to be noted that description is given in the following order.
1. Configuration of Semiconductor Device
2. Application Examples of Semiconductor Device
   2.1. Application Examples to Single-Layer Semiconductor Device
   2.2. Application Examples to Multi-Layer Semiconductor Device
3. Method of Manufacturing Semiconductor Device
   3.1. First Manufacturing Method
   3.2. Second Manufacturing Method
   3.3. Third Manufacturing Method
4. Electronic Apparatus
5. Conclusion

1. CONFIGURATION OF SEMICONDUCTOR DEVICE

First, a configuration of a semiconductor device according to an embodiment of the present disclosure is described with reference to FIG. 1. FIG. 1 is a perspective view for describing a configuration of a semiconductor device 100 according to the present embodiment.

As illustrated in FIG. 1, the semiconductor device 100 includes a first conductivity-type layer 111, an intermediate layer 113, and a second conductivity-type layer 115. Further, a circumferential side surface of the semiconductor device 100 may be covered with a separating layer 120 for electrical insulation purpose.

The first conductivity-type layer 111 includes a semiconductor material into which first conductivity-type impurities are introduced. Specifically, the first conductivity-type layer 111 may include silicon (Si) into which an n-type impurities such as phosphorus (P) or arsenic (As) are introduced. For example, the first conductivity-type layer 111 may be formed as a silicon layer into which the n-type impurities are introduced at a concentration within a range of $1.0 \times 10^{16}$ pieces/cm$^3$ to $1.0 \times 10^{19}$ pieces/cm$^3$ using an ion implantation method or the like.

The second conductivity-type layer 115 includes a semiconductor material into which second conductivity-type impurities are introduced. Specifically, the second conductivity-type layer 115 may include silicon (Si) into which p-type impurities such as boron (B) or aluminum (Al) are introduced. For example, the second conductivity-type layer 115 may be formed as a silicon layer into which the p-type impurities are introduced at a concentration within a range of $1.0 \times 10^{16}$ pieces/cm$^3$ to $1.0 \times 10^{19}$ pieces/cm$^3$ using the ion implantation method or the like.

In the semiconductor device 100 according to the present embodiment, the first conductivity-type impurities and the second conductivity-type impurities represent conductivity-type impurities that are different in polarity from each other. Therefore, as exemplified in the above, in a case where the first conductivity-type impurities are n-type impurities, the second conductivity-type impurities are p-type impurities. On the contrary, in a case where the first conductivity-type impurities are p-type impurities, the second conductivity-type impurities are n-type impurities.

The intermediate layer 113 is provided to be sandwiched in a stacking direction between the first conductivity-type layer 111 and the second conductivity-type layer 115. The intermediate layer 113 includes a semiconductor material that does not include conductivity-type impurities, or a semiconductor material that includes conductivity-type impurities at a concentration lower than a concentration of conductivity-type impurities in the first conductivity-type layer 111 or the second conductivity-type layer 115.

Specifically, the intermediate layer 113 may be a silicon layer that does not include the p-type impurities or the n-type impurities, or a silicon layer that includes the p-type impurities or the n-type impurities at a concentration lower than a concentration of the p-type impurities in the first conductivity-type layer 111 or n-type impurities in the second conductivity-type layer 115. For example, the intermediate layer 113 may be formed as a silicon layer into which the n-type impurities are introduced at a concentration within a range of $1.0 \times 10^{14}$ pieces/cm$^3$ to $1.0 \times 10^{15}$ pieces/cm$^3$ using the ion implantation method or the like. It is to be noted that the intermediate layer 113 is a layer characterized by a lower doping concentration of the p-type impurities or the n-type impurities as compared with the first conductivity-type layer 111 and the second conductivity-type layer 115, and it is not specifically limitative whether or not the intermediate layer 113 includes the p-type impurities or the n-type impurities.

Each of the first conductivity-type layer 111, the intermediate layer 113, and the second conductivity-type layer 115 as described above includes a semiconductor material, and these layers are different in any one or more of presence or absence, a type, and a concentration of the conductivity-type impurities included in the semiconductor material. Therefore, the first conductivity-type layer 111, the intermediate layer 113, and the second conductivity-type layer 115 may include the same semiconductor material. For example, each of the first conductivity-type layer 111, the intermediate layer 113, and the second conductivity-type layer 115 may include silicon.

However, it goes without saying that the first conductivity-type layer 111, the intermediate layer 113, and the second conductivity-type layer 115 may include a semiconductor material other than silicon. For example, the first conductivity-type layer 111, the intermediate layer 113, and the second conductivity-type layer 115 may include another elemental semiconductor such as germanium (Ge), or a compound semiconductor such as gallium arsenide (GaAs), gallium nitride (GaN), or silicon carbide (SiC).

The separating layer 120 is provided using an insulating material to surround a side surface of a stacking body of the first conductivity-type layer 111, the intermediate layer 113, and the second conductivity-type layer 115. For example, the separating layer 120 may be provided using the insulating material such as silicon oxide (SiOx), silicon nitride (SiNx), or silicon oxynitride (SiON). The separating layer 120 allows a leakage current from the semiconductor device 100 to be suppressed by forming an electrically insulating layer on the side surface of the stacking body of the first conductivity-type layer 111, the intermediate layer 113, and the second conductivity-type layer 115.

In the stacking body including the first conductivity-type layer 111, the intermediate layer 113, and the second conductivity-type layer 115, an upper surface of the second conductivity-type layer 115 and a lower surface of the first conductivity-type layer 111 that are opposed to each other in a stacking direction are not covered with the separating layer 120, and are exposed. The exposed upper surface of the second conductivity-type layer 115 and the exposed lower surface of the first conductivity-type layer 111 function as terminals of the semiconductor device 100, and it is possible to electrically couple these terminals to a variety of wiring lines through a via and the like, for example. The exposed upper surface of the second conductivity-type layer 115 and the exposed lower surface of the first conductivity-type layer 111 may be doped with high-concentration conductivity-type impurities to reduce contact resistance between the semiconductor device 100 and the via.

With such configurations, in the semiconductor device 100 according to the present embodiment, a PIN structure is formed in which a p-type semiconductor and an n-type semiconductor (that is, the first conductivity-type layer 111 and the second conductivity-type layer 115) are joined in the stacking direction with a semiconductor layer (that is, the intermediate layer 113) doped at a low concentration or undoped interposed therebetween. In the PIN structure, a depletion layer with an extremely low carrier concentration is formed from the first conductivity-type layer 111 and the second conductivity-type layer 115 toward the intermediate layer 113. In the semiconductor device 100 according to the present embodiment, the depletion layer allows for a rise in a breakdown voltage, which makes it possible to ensure high withstand voltage performance.

For example, in a PIN-structure diode, to achieve high withstand voltage performance (for example, more than 20 V) that exceeds withstand voltage performance of a PN-junction diode (for example, about 10 V), it is necessary for the intermediate layer 113 to have a thickness exceeding several μm. In the semiconductor device 100 according to the present embodiment, forming the PIN structure in the stacking direction allows for reduction in a planar area occupied by the semiconductor device 100, as compared with a case where the PIN structure is formed in a planar direction.

It is to be noted that, in the semiconductor device 100, on a surface of the first conductivity-type layer 111 or the second conductivity-type layer 115 that is opposed to a surface thereof on which the intermediate layer 113 is provided, a layer including conductivity-type impurities having different polarity may be provided. Specifically, on a surface of the first conductivity-type layer 111 that is opposed to a surface thereof on which the intermediate layer 113 is provided, a layer including the second conductivity-type impurities may be provided. Alternatively, on a surface of the second conductivity-type layer 115 that is opposed to a surface thereof on which the intermediate layer 113 is provided, a layer including the first conductivity-type impurities may be provided. In such a case, the semiconductor device 100 has an NPIN (N-P-Intrinsic-N) structure or a PINP (P-Intrinsic-N-P) structure obtained by replacing a PN-junction of a bipolar transistor having an NPN structure or a PNP structure with a PIN-junction. Such a structure also allows the semiconductor device 100 to function as a high withstand voltage element.

Next, a more specific configuration of the semiconductor device 100 according to the present embodiment is described with reference to FIG. 2. FIG. 2 is a top view and a cross-sectional view for describing the configuration of the semiconductor device 100 according to the present embodiment. It is to be noted that, in directly facing FIG. 2, a diagram on the upside is the top view of the semiconductor device 100, and a diagram on the downside is the cross-sectional view of the semiconductor device 100.

As illustrated in FIG. 2, for example, the semiconductor device 100 may be provided inside a semiconductor substrate 130, and may be electrically insulated from the semiconductor substrate 130 by the separating layer 120.

The semiconductor substrate 130 is a substrate that includes a semiconductor material. For example, the semiconductor substrate 130 may be a silicon substrate. In a case where the semiconductor substrate 130 is a readily processible silicon substrate, it is possible to form the semiconductor device 100 inside the semiconductor substrate 130 more easily. However, the semiconductor substrate 130 may be a substrate that includes another elemental semiconductor such as germanium (Ge), or a substrate that includes a compound semiconductor such as gallium arsenide (GaAs), gallium nitride (GaN), or silicon carbide (SiC).

Further, the semiconductor substrate 130 may be reduced in thickness by CMP (Chemical Mechanical Polishing) or the like. It is possible to provide the semiconductor device 100 according to the present embodiment penetrating through the semiconductor substrate 130. Therefore, to achieve withstand voltage performance of the semiconductor device 100 as desired characteristics, the semiconductor substrate 130 may be reduced in thickness within a range of several μm to several dozen μm to ensure that a thickness of the intermediate layer 113 falls within a range of several μm to several dozen μm, and may be reduced in thickness within a range of about 2 μm to about 20 μm, for example. A typical semiconductor substrate 130 available commercially to form a semiconductor device is about several hundred μm in thickness, and thus reduction in thickness down to the above-described range of the semiconductor substrate 130 makes it possible to more easily form the semiconductor device 100 that includes the desired characteristics.

As described above, the semiconductor device 100 is provided to penetrate through the semiconductor substrate 130 in a stacking structure of the first conductivity-type layer 111, the intermediate layer 113, and the second conductivity-type layer 115. Specifically, it is possible to form the semiconductor device 100 by introducing predetermined conductivity-type impurities (either the first conductivity-type impurities or the second conductivity-type impurities) into regions in a thickness direction of the semiconductor substrate 130 that correspond to the first conductivity-type layer 111 and the second conductivity-type layer 115. In other words, in the semiconductor substrate 130, a region into which the first conductivity-type impurities are introduced becomes the first conductivity-type layer 111, and a region into which the second conductivity-type impurities are introduced becomes the second conductivity-type layer 115. Further, a region sandwiched between the above-described first conductivity-type layer 111 and second conductivity-type layer 115 in the thickness direction of the semiconductor substrate 130 becomes the intermediate layer 113.

The semiconductor device 100 is provided to penetrate through the semiconductor substrate 130, which makes it possible to expose the first conductivity-type layer 111 and the second conductivity-type layer 115 respectively on both respective main surfaces opposed to each other of the semiconductor substrate 130. This allows the semiconductor device 100 to use the exposed first conductivity-type layer 111 and exposed second conductivity-type layer 115 as terminals of a PIN-structure diode, which makes it possible to easily form electrical coupling of the semiconductor device 100 to a variety of wiring lines.

However, the first conductivity-type layer 111 and the second conductivity-type layer 115 may not be exposed on both the main surfaces opposed to each other of the semiconductor substrate 130 from a point of time when such layers are formed. For example, after the first conductivity-type layer 111 and the second conductivity-type layer 115 are formed inside the semiconductor substrate 130, the first conductivity-type layer 111 and the second conductivity-type layer 115 may be exposed on both the main surfaces opposed to each other of the semiconductor substrate 130 by reducing the semiconductor substrate 130 in thickness at a subsequent stage.

The separating layer 120 is provided to penetrate through the semiconductor substrate 130 and surround a side surface of the semiconductor device 100 that is provided as the stacking body of the first conductivity-type layer 111, the intermediate layer 113, and the second conductivity-type layer 115. Specifically, it is possible to form the separating layer 120 by removing the semiconductor substrate 130 around the semiconductor device 100 by etching or the like, and thereafter filling a removed region with an insulating material. For example, the separating layer 120 may be formed by filling an opening of the semiconductor substrate 130 with the insulating material such as silicon oxide (SiOx), silicon nitride (SiNx), or silicon oxynitride (SiON). In other words, the separating layer 120 may be formed by a method similar to a so-called STI (Shallow Trench Isolation) method.

Here, the separating layer 120 may be formed by filling an opening that is formed by etching from the one main surface of the semiconductor substrate 130 with the insulating material, or may be formed by filling each of openings that are formed by etching from both the main surfaces opposed to each other of the semiconductor substrate 130 with the insulating material.

It is possible to determine an etching direction at the time of formation of the separating layer 120 depending on, for example, how a cross-sectional shape of the separating layer 120 in a thickness direction of the semiconductor substrate 130 is tapered. Specifically, in a case where the tapered direction of the cross-sectional shape of the separating layer 120 is the same, it is possible to determine that the separating layer 120 is formed by etching only from the one main surface of the semiconductor substrate 130. In contrast, in a case where the tapered direction of the cross-sectional shape of the separating layer 120 is reversed halfway, it is possible to determine that the separating layer 120 is formed by etching each from both the main surfaces opposed to each other of the semiconductor substrate 130. In the separating layer 120 illustrated in FIG. 2, the tapered direction of the cross-sectional shape of the separating layer 120 is fixed; therefore, it is possible to determine that this separating layer 120 is formed by etching only from the one main surface of the semiconductor substrate 130 on the side where the first conductivity-type layer 111 is provided.

According to the semiconductor device 100 that has such a configuration, it is possible to provide the PIN structure in the thickness direction of the semiconductor substrate 130, which allows for reduction in the planar area occupied by the semiconductor device 100, as compared with a case where the PIN structure is provided in an in-plane direction of the semiconductor substrate 130. Further, the semiconductor device 100 is provided to penetrate through the semiconductor substrate 130, which makes it possible to easily form electrical coupling to a variety of wiring lines.

2. APPLICATION EXAMPLES OF SEMICONDUCTOR DEVICE

Subsequently, application examples of the semiconductor device 100 according to the present embodiment are described with reference to FIGS. 3A, 3B, 3C, 4A, 4B, and 4C. Each of FIGS. 3A, 3B, and FIG. 3C is a are cross-sectional views of an example in which the semiconductor device 100 according to the present embodiment is applied to a single-layer semiconductor device. Each of FIGS. 4A, 4B, and 4C is a are cross-sectional views of an example in which the semiconductor device 100 according to the present embodiment is applied to a multi-layer semiconductor device.

(2.1. Application Examples to Single-Layer Semiconductor Device)

First, application examples of the semiconductor device 100 according to the present embodiment to a single-layer semiconductor device are described with reference to Each of FIGS. 3A, 3B, and 3C.

As illustrated in FIG. 3A, a single-layer semiconductor device 11 includes one semiconductor substrate 130, and one multi-layer wiring layer 140 that is formed on the semiconductor substrate 130.

The semiconductor substrate 130 is a silicon substrate that is reduced in thickness within a range of, for example, several µm to several dozen µm (for example, 2 µm to 20 µm). On the semiconductor substrate 130, for example, a PIN diode 100 (that is, the above-described semiconductor device 100), a field-effect transistor 145, and the like are provided to be isolated by the separating layer 120 and an element separating layer 121.

As described above, the PIN diode 100 is configured by stacking the first conductivity-type layer 111, the intermediate layer 113, and the second conductivity-type layer 115 in the thickness direction of the semiconductor substrate 130, and functions as a withstand voltage element. The field-effect transistor 145 is, for example, a MOSFET (Metal-Oxide-Semiconductor Field-Effect Transistor), and executes signal processing and the like in the single-layer semiconductor device 11.

It is to be noted that the field-effect transistor 145 is an example of an active element and a passive element that are provided on the semiconductor substrate 130, and an element provided on the semiconductor substrate 130 is not limited to the field-effect transistor 145. Further, a plurality of other active elements and a plurality of other passive elements may be provided on the semiconductor substrate 130.

Each of the separating layer 120 and the element separating layer 121 includes, for example, an insulating material such as silicon oxide, and electrically isolates the PIN diode 100 and the field-effect transistor 145 from each other to prevent the PIN diode 100 and the field-effect transistor 145 from being electrically conducted through the semiconductor substrate 130. It is to be noted that, in order to electrically isolate the PIN diode 100, the separating layer 120 is provided to penetrate through the semiconductor substrate 130. In contrast, the element separating layer 121 may not be provided to penetrate through the semiconductor substrate 130, and may be provided to a predetermined depth allowing for electrical isolation of the field-effect transistor 145.

The multi-layer wiring layer 140 is provided on the semiconductor substrate 130 by stacking a plurality of interlayer insulating films 143 including an insulating material, for example. In addition, for example, a wiring layer 142 that transmits signals from the PIN diode 100, the field-effect transistor 145, and the like is provided inside the multi-layer wiring layer 140. The wiring layer 142 is electrically coupled to the PIN diode 100, the field-effect transistor 145, or the like that are provided on the semiconductor substrate 130 through a via 141 provided in a lowermost layer. It is possible for the wiring layer 142 to take signals from the PIN diode 100, the field-effect transistor 145, and the like through the via 141.

The interlayer insulating film 143 may include a heretofore known insulating material such as $SiO_2$ or SiN, for example. As an alternative, the interlayer insulating film 143 may include a single kind of insulating material, or may include a plurality of kinds of insulating materials. The wiring layer 142 may include, for example, a metallic material, such as copper (Cu) or aluminum (Al), that has relatively low resistance to allow for signal transmission at higher speed. The via 141 may include, for example, a metallic material, such as tungsten (W), that has high opening filling property at the time of forming a film.

The PIN diode 100 (that is, the above-described semiconductor device 100) is applicable as a withstand voltage element to such a single-layer semiconductor device 11. The PIN diode 100 is usable as a withstand voltage protection element that protects an internal circuit against a surge voltage from an external circuit by coupling, to a bump and the like, the first conductivity-type layer 111 that is exposed on a rear surface of the semiconductor substrate 130 (that is, a surface opposed to a surface on which the multi-layer wiring layer 140 is provided).

Next, another example of the single-layer semiconductor device is described with reference to FIG. 3B.

As illustrated in FIG. 3B, a single-layer semiconductor device 12 includes one semiconductor substrate 130, and one multi-layer wiring layer 140 that is formed on the semiconductor substrate 130. On the semiconductor substrate 130, for example, a PIN diode 100A, the field-effect transistor 145, and the like are provided to be isolated by a separating layer 120A and the element separating layer 121.

The PIN diode 100A is configured by stacking a first conductivity-type layer 111A, an intermediate layer 113A, and a second conductivity-type layer 115A in the thickness direction of the semiconductor substrate 130.

It is to be noted that, in configurations, other than cross-sectional shapes, of the PIN diode 100A and the separating layer 120A, respective configurations of the single-layer semiconductor device 12 illustrated in FIG. 3B are substantially similar to respective configurations of the single-layer semiconductor device 11 illustrated in FIG. 3A. Therefore, description of these configurations is not repeated here.

The single-layer semiconductor device 12 illustrated in FIG. 3B is different in only the cross-sectional shapes of the PIN diode 100A and the separating layer 120A as compared with the single-layer semiconductor device 11 illustrated in FIG. 3A. Specifically, in the single-layer semiconductor device 12 illustrated in FIG. 3B, the cross-sectional shapes of the PIN diode 100A and the separating layer 120A are hexagonal shapes in which a tapered direction is reversed halfway. In contrast, in the single-layer semiconductor device 11 illustrated in FIG. 3A, the cross-sectional shapes of the PIN diode 100 and the separating layer 120 are trapezoidal shapes that are tapered in one direction.

Such a difference in the cross-sectional shape of the separating layer 120A is possibly made by a difference in a process of forming the separating layer 120A. Specifically, in a case where an opening with a high aspect ratio is formed by etching, the thus-formed opening has a reverse-tapered shape in which a bottom portion is smaller in area than a top portion on the opening side.

The separating layer 120A of the single-layer semiconductor device 12 illustrated in FIG. 3B is formed by filling each of openings provided by etching from both the main surfaces opposed to each other of the semiconductor substrate 130 with the insulating material, thereby having a hexagonal shape in which a tapered direction is reversed halfway. In contrast, the separating layer 120 of the single-layer semiconductor device 11 illustrated in FIG. 3A is formed by filling an opening provided by etching from the one main surface of the semiconductor substrate 130 with the insulating material, thereby having a trapezoidal shape that is tapered in one direction.

In the single-layer semiconductor device 12 illustrated in FIG. 3B, a portion of the separating layer 120A is formed simultaneously with the element separating layer 121 from a surface side of the semiconductor substrate 130 on which the field-effect transistor 145 is formed, and thereafter a remaining portion of the separating layer 120A is formed from a surface opposed to the surface, on which the element separating layer 121 is formed, of the semiconductor substrate 130. This makes it possible to form the separating layer 120A that penetrates through the semiconductor substrate 130 in the single-layer semiconductor device 12 illustrated in FIG. 3B.

In the single-layer semiconductor device 12 illustrated in FIG. 3B, an opening with a high aspect ratio that penetrates through the semiconductor substrate 130 may not be formed at the time of formation of the separating layer 120A, which makes it possible to reduce the level of difficulty in etching at the time of formation of the separating layer 120A.

Further, still another example of the single-layer semiconductor device is described with reference to FIG. 3C.

As illustrated in FIG. 3C, a single-layer semiconductor device 13 includes one semiconductor substrate 130A, and one multi-layer wiring layer 140 that is formed on the semiconductor substrate 130A. On the semiconductor substrate 130A, for example, the PIN diode 100, a field-effect transistor (unillustrated), and the like are provided to be isolated by the separating layer 120 and the element separating layer 121. The PIN diode 100 is configured by stacking the first conductivity-type layer 111, the intermediate layer 113, and the second conductivity-type layer 115 in the thickness direction of the semiconductor substrate 130.

Here, in the single-layer semiconductor device 13 illustrated in FIG. 3C, the semiconductor substrate 130A is not reduced in thickness, and has a thickness of about several hundred μm. Therefore, in a case where the PIN diode 100 is formed to penetrate through the semiconductor substrate 130A, an entire height of the PIN diode 100 is about several hundred μm, which makes it difficult to achieve the PIN diode 100 having desired characteristics.

Hence, in the single-layer semiconductor device 13 illustrated in FIG. 3C, the PIN diode 100 is first formed with a height having the desired characteristics. Thereafter, an opening 131 is provided that exposes the PIN diode 100 from a surface opposed to a surface, on which the multi-layer wiring layer 140 is provided, of the semiconductor substrate 130A, which allows for electrical coupling to the PIN diode 100.

In the single-layer semiconductor device 13 illustrated in FIG. 3C, the semiconductor substrate 130 is not reduced in thickness, and has a thickness of about several hundred μm, which makes it possible to enhance mechanical strength of the single-layer semiconductor device 13.

It is to be noted that, in the configuration, other than the thickness, of the semiconductor substrate 130A, respective configurations of the single-layer semiconductor device 13 illustrated in FIG. 3C are substantially similar to respective configurations of the single-layer semiconductor device 11 illustrated in FIG. 3A. Therefore, description of these configurations is not repeated here.

(2.2. Application Examples to Multi-Layer Semiconductor Device)

Next, application examples of the semiconductor device 100 according to the present embodiment to a multi-layer semiconductor device are described with reference to Each of FIGS. 4A, 4B, and 4C.

As illustrated in FIG. 4A, a multi-layer semiconductor device 21 includes a substrate including a semiconductor substrate 130 and a multi-layer wiring layer 140 that is formed on the semiconductor substrate 130, and a substrate including a semiconductor substrate 230 and a multi-layer wiring layer 240 that is formed on the semiconductor substrate 130. In other words, the multi-layer semiconductor device 21 is a semiconductor device including two semiconductor substrates bonded to each other, and may be, for example, a back-illuminated solid-state imaging device.

In the multi-layer semiconductor device 21, the substrate including the semiconductor substrate 130 and the multi-layer wiring layer 140 that is formed on the semiconductor substrate 130, and the substrate including the semiconductor substrate 230 and the multi-layer wiring layer 240 that is formed on the semiconductor substrate 230 are bonded to each other to cause the multi-layer wiring layers 140 and 240 to be opposed to each other (that is, in face to face) with an insulating layer 151 interposed therebetween. However, it goes without saying that, in the multi-layer semiconductor device 21, the substrates may be bonded to each other to cause the semiconductor substrate 130 and the multi-layer wiring layer 240 to be opposed to each other, or to cause the multi-layer wiring layer 140 and the semiconductor substrate 230 to be opposed to each other (that is, in face to back).

The semiconductor substrate 130 is, for example, a silicon substrate that is reduced in thickness within a range of several μm to several dozen μm (for example, 2 μm to 20 μm). On the semiconductor substrate 130, for example, the PIN diode 100 (that is, the above-described semiconductor device 100), the field-effect transistor 145, and the like are provided to be isolated by the separating layer 120 and the element separating layer 121.

As described above, the PIN diode 100 is configured by stacking a first conductivity-type layer, an intermediate layer, and a second conductivity-type layer in the thickness direction of the semiconductor substrate 130, and functions as a withstand voltage element. The field-effect transistor 145 is, for example, a MOSFET, and executes signal processing and the like in the multi-layer semiconductor device 21.

It is to be noted that the field-effect transistor 145 is an example of an active element and a passive element provided on the semiconductor substrate 130, and an element provided on the semiconductor substrate 130 is not limited to the field-effect transistor 145. Further, a plurality of other active elements and a plurality of other passive elements may be provided on the semiconductor substrate 130.

Each of the separating layer 120 and the element separating layer 121 includes, for example, an insulating material such as silicon oxide, and electrically isolates the PIN diode 100, the field-effect transistor 145, and the like that are formed on the semiconductor substrate 130 from one another. It is to be noted that, in order to electrically isolate the PIN diode 100, the separating layer 120 is provided to penetrate through the semiconductor substrate 130. In contrast, the element separating layer 121 may not be provided to penetrate through the semiconductor substrate 130.

The multi-layer wiring layer 140 is provided on the semiconductor substrate 130 by stacking the plurality of interlayer insulating films 143 including an insulating material, for example. In addition, for example, the wiring layer 142 that transmits signals from the PIN diode 100, the field-effect transistor 145, and the like is provided inside the multi-layer wiring layer 140. The wiring layer 142 is electrically coupled to the PIN diode 100, the field-effect transistor 145, and the like that are provided on the semiconductor substrate 130 through the via 141 provided in a lowermost layer. It is possible for the wiring layer 142 to take signals from the PIN diode 100, the field-effect transistor 145, and the like through the via 141.

A twin contact 551 is provided on a surface opposed to a surface, on which the multi-layer wiring layer 140 is provided, of the semiconductor substrate 130 to take a signal from the PIN diode 100. Specifically, the twin contact 551 is formed by filling an opening for exposing either the first conductivity-type layer or the second conductivity-type layer of the PIN diode 100, and an opening for exposing the wiring layer 142 with a metallic material such as copper (Cu), or the like, and coupling both the openings filled with the metallic material to each other.

The interlayer insulating film 143 may include a heretofore known insulating material such as $SiO_2$ or SiN, for example. As an alternative, the interlayer insulating film 143 may include a single kind of insulating material, or may include a plurality of kinds of insulating materials. The wiring layer 142 may include, for example, a metallic material, such as copper (Cu) or aluminum (Al), that has relatively low resistance. This allows the wiring layer 142 to transmit signals at higher speed. The via 141 may include, for example, a metallic material, such as tungsten (W), that has high opening filling property at the time of forming a film.

The semiconductor substrate 230 is, for example, a silicon substrate. The semiconductor substrate 230 may be reduced in thickness, or may not be reduced in thickness. On the semiconductor substrate 230, for example, a field-effect transistor 245 and the like are provided to be isolated by an element separating layer 221. The field-effect transistor 245 is, for example, a MOSFET, and executes signal processing and the like in the multi-layer semiconductor device 21.

It is to be noted that the field-effect transistor 245 is an example of an active element and a passive element that are provided on the semiconductor substrate 230, and an element provided on the semiconductor substrate 230 is not limited to the field-effect transistor 245. Further, a plurality of other active elements and a plurality of other passive elements may be provided on the semiconductor substrate 230.

The element separating layer 221 includes, for example, an insulating material such as oxide silicon, and electrically isolates the field-effect transistor 245 and the like that are formed on the semiconductor substrate 230 from each other.

The multi-layer wiring layer 240 is provided on the semiconductor substrate 230 by stacking a plurality of interlayer insulating films 243 including an insulating material, for example. In addition, for example, a wiring layer 242 that transmits signals from the field-effect transistor 245 and the like is provided inside the multi-layer wiring layer 240. The wiring layer 242 is electrically coupled to the field-effect transistor 245 and the like that are provided on the semiconductor substrate 230 through a via 241 provided in a lowermost layer. It is possible for the wiring layer 242 to take signals from the field-effect transistor 245 and the like through the via 241.

An interlayer insulating film 243 may include a heretofore known insulating material such as $SiO_x$ or $SiN_x$, for example. As an alternative, the interlayer insulating film 243 may include a single kind of insulating material, or may include a plurality of kinds of insulating materials. The wiring layer 242 may include, for example, a metallic material, such as copper (Cu) or aluminum (Al), that has relatively low resistance to allow for signal transmission at higher speed. The via 241 may include, for example, a metallic material such as tungsten (W) that had high opening filling property at the time of forming a film.

The insulating layer 151 includes, for example, a heretofore known insulating material such as $SiO_x$ or $SiN_x$, and is provided between the multi-layer wiring layer 140 and the multi-layer wiring layer 240. The insulating layer 151 electrically insulates the wiring layer 142 inside the multi-layer wiring layer 140 and the wiring layer 242 inside the multi-layer wiring layer 240 from each other.

It is to be noted that use of heretofore known methods makes it possible to form electrical coupling between the wiring layer 142 inside the multi-layer wiring layer 140 and the wiring layer 242 inside the multi-layer wiring layer 240. For example, it is possible to form electrical coupling between the wiring layer 142 inside the multi-layer wiring layer 140 and the wiring layer 242 inside the multi-layer wiring layer 240 by, for example, a contact via that is provided to penetrate through the insulating layer 151, a twin contact via that forms electrical coupling by filling a plurality of through-holes with an electrically conductive material, an electrode junction structure that forms electrical coupling by joining electrodes exposed on a bonding surface, and the like.

A pad 533 is a metallic layer that is exposed by an opening 531, and functions as an input/output section (an I/O section) of the multi-layer semiconductor device 21. Coupling of wire bonding or the like to the pad 533 makes it possible to form electrical coupling between the multi-layer semiconductor device 21 and an external circuit. The pad 533 may include, for example, a metallic material, such as aluminum (Al), that facilitates electrical coupling by wire bonding or the like.

An insulating layer 510 is provided on a surface side opposed to a surface, on which the multi-layer wiring layer 140 is provided, of the semiconductor substrate 130, and functions as a protective layer that protects an internal circuit and the like of the multi-layer semiconductor device 21. The insulating layer 510 may include a transparent insulating material such as $SiO_x$, $SiN_x$, $Al_2O_3$, or $TiO_2$, for example.

Microlenses 520 are provided in a case where the multi-layer semiconductor device 21 is a solid-state imaging device, and enhances sensitivity of the solid-state imaging device by collecting light from an imaging object. Further, in a case where the multi-layer semiconductor device 21 is the solid-state imaging device, a color filter having any color of red, green, or blue may be provided on each of the microlenses 520 to allow for color imaging.

The PIN diode 100 (that is, the above-described semiconductor device 100) is applicable as a withstand voltage element to such a multi-layer semiconductor device 21 having a two-layer structure. In the multi-layer semiconductor device 21, a multi-layer wiring layer or a semiconductor substrate is provided on each of the main surfaces opposed to each other of the semiconductor substrate 130 on which the PIN diode 100 is provided, which makes it possible to form electrical coupling to the PIN diode 100 more easily. Accordingly, the PIN diode 100 is usable as a withstand voltage protection element that protects an internal circuit against a surge voltage arising in the multi-layer semiconductor device 21.

It is to be noted that, in the multi-layer semiconductor device 21 illustrated in FIG. 4A, an example in which the PIN diode 100 is provided inside the semiconductor substrate 130 is given; however, it goes without saying that the PIN diode 100 may be provided inside the semiconductor substrate 230.

Next, another example of the multi-layer semiconductor device is described with reference to FIG. 4B.

As illustrated in FIG. 4B, a multi-layer semiconductor device 31 includes a substrate including the semiconductor substrate 130 and the multi-layer wiring layer 140 that is formed on the semiconductor substrate 130, a substrate including the semiconductor substrate 230 and the multi-layer wiring layer 240 that is formed on the semiconductor substrate 230, and a substrate including a semiconductor substrate 330 and a multi-layer wiring layer 340 that is formed on the semiconductor substrate 330. In other words, the multi-layer semiconductor device 31 is a semiconductor device including three semiconductor substrates bonded together, and may be, for example, a back-illuminated solid-state imaging device.

In the multi-layer semiconductor device 31, the substrate including the semiconductor substrate 130 and the multi-layer wiring layer 140 that is formed on the semiconductor substrate 130, and the substrate including the semiconductor substrate 230 and the multi-layer wiring layer 240 that is formed on the semiconductor substrate 230 are bonded to each other to cause the multi-layer wiring layers 140 and 240 to be opposed to each other with the insulating layer 151 interposed therebetween. Meanwhile, the substrate including the semiconductor substrate 130 and the multi-layer wiring layer 140 that is formed on the semiconductor substrate 130, and the substrate including the semiconductor substrate 330 and the multi-layer wiring layer 340 that is formed on the semiconductor substrate 330 are bonded to each other to cause the semiconductor substrate 130 and the multi-layer wiring layer 340 to be opposed to each other with an insulating layer 152 interposed therebetween.

In the multi-layer semiconductor device 31 illustrated in FIG. 4B, it is possible to electrically couple the PIN diode 100 to a field-effect transistor 345 and the like that are provided in the multi-layer wiring layer 340 by an electrode junction structure 552. In the multi-layer semiconductor device 31 illustrated in FIG. 4B, configurations identical in name and reference numeral to the configurations described in the multi-layer semiconductor device 21 illustrated in FIG. 4A are substantially as described in the multi-layer semiconductor device 21 illustrated in FIG. 4A; therefore, description thereof is not repeated here.

The semiconductor substrate 330 is, for example, a silicon substrate that is reduced in thickness within a range of several μm to several dozen μm (for example, 2 μm to 20 μm). On the semiconductor substrate 330, for example, the field-effect transistor 345 and the like are provided. The field-effect transistor 345 is, for example, a MOSFET, and executes signal processing and the like in the multi-layer semiconductor device 31.

It is to be noted that the field-effect transistor 345 is an example of an active element and a passive element provided on the semiconductor substrate 330, and an element provided on the semiconductor substrate 330 is not limited to the field-effect transistor 345. Further, a plurality of other active elements and a plurality of other passive elements may be provided on the semiconductor substrate 330.

The multi-layer wiring layer 340 is provided on the semiconductor substrate 330 by stacking a plurality of interlayer insulating films including a heretofore known insulating material such as $SiO_x$ or $SiN_x$, for example. In addition, for example, a wiring layer (not illustrated) that transmits signals from the field-effect transistor 345 and the like may be provided inside the multi-layer wiring layer 340. The wiring layer is electrically coupled to the field-effect transistor 345 and the like that are provided on the semiconductor substrate 330 through a via (not illustrated) provided in a lowermost layer. It is to be noted that the wiring layer and the via may include, for example a metallic material, such as copper (Cu), aluminum (Al), or (W), that has relatively low resistance.

The insulating layer 152 includes, for example, a heretofore known insulating material such as $SiO_x$ or $SiN_x$, and is provided between the multi-layer wiring layer 340 and the semiconductor substrate 130. The insulating layer 152 electrically insulates the multi-layer wiring layer 340 and the semiconductor substrate 130 from each other.

The electrode junction structure 552 is an electrical coupling structure that is formed by joining electrodes exposed on a bonding surface of the insulating layer 152 and the multi-layer wiring layer 340. Specifically, the electrode junction structure 552 is formed by bringing an electrode including copper (Cu) formed in the insulating layer 152 and an electrode including copper (Cu) formed in the multi-layer wiring layer 340 into contact with each other and joining both the electrodes by heat treatment.

The PIN diode 100 is applicable as a withstand voltage element also to such a multi-layer semiconductor device 31 having a three-layer structure. Further, a structure that forms electrical coupling between the multi-layer wiring layer 340 and the PIN diode 100 or the multi-layer wiring layer 140 is not limited to the above-described electrode junction structure 552, and it is also possible to use various structures such as a contact via or a twin contact via.

In the multi-layer semiconductor device 31 illustrated in FIG. 4B, an example in which the PIN diode 100 is provided inside the semiconductor substrate 130 is given; however, it goes without saying that the PIN diode 100 may be provided inside the semiconductor substrate 230 or the semiconductor substrate 330.

Next, still another example of the multi-layer semiconductor device is described with reference to FIG. 4C.

As illustrated in FIG. 4C, a multi-layer semiconductor device 32 includes a substrate including the semiconductor substrate 130 and the multi-layer wiring layer 140 that is formed on the semiconductor substrate 130, a substrate including the semiconductor substrate 230 and the multi-layer wiring layer 240 that is formed on the semiconductor substrate 230, and a substrate including the semiconductor substrate 330 and the multi-layer wiring layer 340 that is formed on the semiconductor substrate 330. In other words, the multi-layer semiconductor device 32 is a semiconductor device including three semiconductor substrates bonded together, and may be, for example, a back-illuminated solid-state imaging device.

In the multi-layer semiconductor device 32, the substrate including the semiconductor substrate 130 and the multi-layer wiring layer 140 that is formed on the semiconductor substrate 130, and the substrate including the semiconductor substrate 230 and the multi-layer wiring layer 240 that is formed on the semiconductor substrate 230 are bonded to each other to cause the multi-layer wiring layers 140 and 240 to be opposed to each other with the insulating layer 151 interposed therebetween. Meanwhile, the substrate including the semiconductor substrate 130 and the multi-layer wiring layer 140 that is formed on the semiconductor substrate 130, and the substrate including the semiconductor substrate 330 and the multi-layer wiring layer 340 that is formed on the semiconductor substrate 330 are bonded to each other to cause the semiconductor substrate 130 and the multi-layer wiring layer 340 to be opposed to each other with the insulating layer 152 interposed therebetween.

In the multi-layer semiconductor device 32 illustrated in FIG. 4C, it is possible to electrically couple the PIN diode 100 to the field-effect transistor 345 that is provided in the multi-layer wiring layer 340 and the wiring layer 142 that is provided in the multi-layer wiring layer 140 through twin contacts 551A and 551B. In the multi-layer semiconductor device 32 illustrated in FIG. 4C, configurations identical in names and reference numerals to the configurations described in the multi-layer semiconductor devices 21 and 31 illustrated in FIGS. 4A and 4B are substantially as described in the multi-layer semiconductor devices 21 and 31 illustrated in FIGS. 4A and 4B; therefore, description thereof is not repeated here.

The twin contacts 551A and 551B are provided on a surface opposed to a surface, on which the multi-layer wiring layer 140 is provided, of the semiconductor substrate 130 to take a signal from the PIN diode 100. Specifically, the twin contact 551A is formed by filling an opening for exposing either the first conductivity-type layer or the second conductivity-type layer of the PIN diode 100, and an opening for exposing the wiring layer 142 with a metallic material such as copper (Cu), or the like, and coupling both the openings filled with the metallic material to each other. Further, the twin contact 551B is formed by filling an opening for exposing the twin contact 551A and an opening for exposing a terminal of the field-effect transistor 345 with a metallic material such as copper (Cu), or the like, and coupling both the openings filled with the metallic material to each other.

The PIN diode 100 is applicable as a withstand voltage element also to such a multi-layer semiconductor device 32 having a three-layer structure.

3. METHOD OF MANUFACTURING SEMICONDUCTOR DEVICE

Next, a method of manufacturing the multi-layer semiconductor device 21 illustrated in FIG. 4A is described with reference to FIGS. 5A, 5B, 5C, 5D, 5E, 5F, 6A, 6B, 6C, 6D, 6E, 7A, 7B, 7C, 7D, and 7E.

(3.1. First Manufacturing Method)

A first method of manufacturing the multi-layer semiconductor device 21 is described with reference to FIGS. 5A, 5B, 5C, 5D, and 5E. Each of FIGS. 5A, 5B, 5C, 5D, and 5E is a are longitudinal cross-sectional views for schematically describing each process of the first method of manufacturing the multi-layer semiconductor device 21.

First, as illustrated in FIG. 5A, the separating layer 120 and the element separating layer 121 are formed in predetermined regions of the semiconductor substrate 130. Specifically, openings are formed by etching predetermined regions of one main surface of the semiconductor substrate 130 that includes silicon or the like. Thereafter, the separating layer 120 and the element separating layer 121 are formed by filling the openings formed by etching with an insulating material, and perform planarization. It is to be noted that the separating layer 120 is formed to a region having a depth equal to or greater than a depth of a region in which the element separating layer 121 is formed.

Next, as illustrated in FIG. 5B, the second conductivity-type layer 115 and the field-effect transistor 145 are formed in predetermined regions of the semiconductor substrate 130, and thereafter the interlayer insulating film 143 is formed on the semiconductor substrate 130. Specifically, the second conductivity-type layer 115 is formed by ion-implanting the second conductivity-type impurities in a region surrounded by the separating layer 120 of the semiconductor substrate 130 and performing heat treatment. Further, the field-effect transistor 145 is formed by a heretofore known method in a region surrounded by the element separating layer 121 of the semiconductor substrate 130. Thereafter, the interlayer insulating film 143 is formed using silicon oxide or the like on the one main surface of the semiconductor substrate 130 on which the second conductivity-type layer 115 and the field-effect transistor 145 are formed. It is to be noted that the heat treatment at the time of formation of the second conductivity-type layer 115 may be performed simultaneously with heat treatment for other configurations.

Subsequently, as illustrated in FIG. 5C, the multi-layer wiring layer 140 is formed on the semiconductor substrate 130. Specifically, the multi-layer wiring layer 140 is formed on the semiconductor substrate 130 by repeating film formation of the interlayer insulating film 143, formation of the wiring layer 142, and formation of the via 141 penetrating through the interlayer insulating film 143. For constituent materials of the interlayer insulating film 143, the wiring layer 142, and the via 141, the above-described materials are usable.

Next, as illustrated in FIG. 5D, the semiconductor substrate 130 on which the multi-layer wiring layer 140 is formed in the above-described process, and the semiconductor substrate 230 on which the multi-layer wiring layer 240 is formed in a similar process are bonded to each other with the insulating layer 151 interposed therebetween. Specifically, the semiconductor substrate 130 on which the multi-layer wiring layer 140 is formed, and the semiconductor substrate 230 on which the multi-layer wiring layer 240 is formed are bonded to each other to cause the multi-layer wiring layers 140 and 240 to be opposed to each other. At this time, the wiring layer 142 inside the multi-layer wiring layer 140 and the wiring layer 242 inside the multi-layer wiring layer 240 are electrically insulated from each other by providing the insulating layer 151 on a bonding surface of the multi-layer wiring layers 140 and 240. It is possible to form electrical coupling (not illustrated) between the wiring layer 142 inside the multi-layer wiring layer 140 and the wiring layer 242 inside the multi-layer wiring layer 240 by using a heretofore known method separately.

Thereafter, as illustrated in FIG. 5E, the semiconductor substrate 130 is reduced in thickness by polishing the semiconductor substrate 130 until the separating layer 120 is exposed. Specifically, the semiconductor substrate 130 is reduced in thickness within a range of several μm to several dozen μm (for example, 2 μm to 20 μm) by polishing a surface opposed to a surface, on which the multi-layer wiring layer 140 is provided, of the semiconductor substrate 130 until the separating layer 120 is exposed with use of CMP or the like.

Next, as illustrated in FIG. 5F, the first conductivity-type layer 111 is formed in a predetermined region of the semiconductor substrate 130. Specifically, the first conductivity-type layer 111 is formed by ion-implanting the first conductivity-type impurities in a region surrounded by the separating layer 120 of the semiconductor substrate 130 and performing heat treatment. The first conductivity-type layer 111 is formed in a region having a depth that comes in no contact with the second conductivity-type layer 115, and a region between the first conductivity-type layer 111 and the second conductivity-type layer 115 becomes the intermediate layer 113. This makes it possible to form the semiconductor device 100 including the first conductivity-type layer 111, the intermediate layer 113, and the second conductivity-type layer 115 that are stacked, and the multi-layer semiconductor device including the semiconductor device 100.

(3.2. Second Manufacturing Method)

A second method of manufacturing the multi-layer semiconductor device 21 is described with reference to FIGS. 6A, 6B, 6C, 6D, and 6E. Each of FIGS. 6A, 6B, 6C, 6D, and 6E are longitudinal cross-sectional views for describing each process of the second method of manufacturing the multi-layer semiconductor device 21.

First, as illustrated in FIG. 6A, the separating layer 120 and the element separating layer 121 are formed in predetermined regions of the semiconductor substrate 130. Specifically, openings are formed by etching predetermined regions of one main surface of the semiconductor substrate 130 that includes silicon or the like. Thereafter, the separating layer 120 and the element separating layer 121 are formed by filling the openings formed by etching with an insulating material and performing planarization. It is to be noted that the separating layer 120 is formed to a region having a depth equal to or greater than a depth of a region in which the element separating layer 121 is formed.

Next, as illustrated in FIG. 6B, the first conductivity-type layer 111, the second conductivity-type layer 115, and the field-effect transistor 145 are formed in predetermined regions of the semiconductor substrate 130, and thereafter the interlayer insulating film 143 is formed on the semiconductor substrate 130. Specifically, the first conductivity-type layer 111 and the second conductivity-type layer 115 are formed by ion-implanting the first conductivity-type impurities and the second conductivity-type impurities respectively in a region surrounded by the separating layer 120 of the semiconductor substrate 130 and performing heat treatment. Depths at which the first conductivity-type layer 111 and the second conductivity-type layer 115 are formed are controllable by energy of the first conductivity-type impurities and the second conductivity-type impurities at the time of ion implantation. Therefore, control of a condition of the ion implantation makes it possible to form a stacking structure of the first conductivity-type layer 111, the intermediate layer 113, and the second conductivity-type layer 115. Further, the field-effect transistor 145 is formed by a heretofore known method in a region surrounded by the element separating layer 121 of the semiconductor substrate 130. Thereafter, the interlayer insulating film 143 is formed using silicon oxide or the like on the one main surface of the semiconductor substrate 130 on which the second conductivity-type layer 115 and the field-effect transistor 145 are formed.

Subsequently, as illustrated in FIG. 6C, the multi-layer wiring layer 140 is formed on the semiconductor substrate 130. Specifically, the multi-layer wiring layer 140 is formed on the semiconductor substrate 130 by repeating film formation of the interlayer insulating film 143, formation of the wiring layer 142, and formation of the via 141 penetrating through the interlayer insulating film 143. For constituent materials of the interlayer insulating film 143, the wiring layer 142, and the via 141, the above-described materials are usable.

Next, as illustrated in FIG. 6D, the semiconductor substrate 130 on which the multi-layer wiring layer 140 is formed in the above-described process, and the semiconductor substrate 230 on which the multi-layer wiring layer 240 is formed in a similar process are bonded to each other with the insulating layer 151 interposed therebetween. Specifically, the semiconductor substrate 130 on which the multi-layer wiring layer 140 is formed, and the semiconductor substrate 230 on which the multi-layer wiring layer 240 is formed are bonded to each other to cause the multi-layer wiring layers 140 and 240 to be opposed to each other. At this time, the wiring layer 142 inside the multi-layer wiring layer 140 and the wiring layer 242 inside the multi-layer wiring layer 240 are electrically insulated from each other by providing the insulating layer 151 on a bonding surface of the multi-layer wiring layers 140 and 240. It is possible to form electrical coupling (not illustrated) between the wiring layer 142 inside the multi-layer wiring layer 140 and the wiring layer 242 inside the multi-layer wiring layer 240 by using a heretofore known method separately.

Thereafter, as illustrated in FIG. 6E, the semiconductor substrate 130 is reduced in thickness by polishing the semiconductor substrate 130 until the first conductivity-type layer 111 is exposed. Specifically, the semiconductor substrate 130 is reduced in thickness within a range of several μm to several dozen μm (for example, 2 μm to 20 μm) by polishing a surface opposed to a surface, on which the multi-layer wiring layer 140 is provided, of the semiconductor substrate 130 until the first conductivity-type layer 111 is exposed with use of CMP or the like. This makes it possible to form the semiconductor device 100 including the first conductivity-type layer 111, the intermediate layer 113, and the second conductivity-type layer 115 that are stacked, and the multi-layer semiconductor device including the semiconductor device 100.

(3.3. Third Manufacturing Method)

A third method of manufacturing the multi-layer semiconductor device 21 is described with reference to FIGS. 7A, 7B, 7C, 7D, and 7E. Each of FIGS. 7A, 7B, 7C, 7D, and 7E are longitudinal cross-sectional views for describing each process of the third method of manufacturing the multi-layer semiconductor device 21.

First, as illustrated in FIG. 7A, the separating layer 120 of which a portion of which serves as a diffusion layer 123, and the element separating layer 121 are formed in predetermined regions of the semiconductor substrate 130. Specifically, openings are formed by etching predetermined regions of one main surface of the semiconductor substrate 130 that includes silicon or the like. In the opening in which the separating layer 120 is to be formed, the diffusion layer 123 is first formed by filling a portion of the opening with a material that is prepared by adding the first conductivity-type impurities to an inorganic insulating substance, and thereafter the separating layer 120 is formed by filling a remaining portion of the opening with an insulating material and performing planarization. Meanwhile, in the opening in which the element separating layer 121 is to be formed, the element separating layer 121 is formed by filling the opening with the insulating material and performing planarization.

Next, as illustrated in FIG. 7B, the first conductivity-type layer 111 and the second conductivity-type layer 115 are formed in a predetermined region of the semiconductor substrate 130 by introducing the second conductivity-type impurities and thereafter performing heat treatment. Thereafter, the field-effect transistor 145 is formed in a predetermined region of the semiconductor substrate 130, and then the interlayer insulating film 143 is formed on the semiconductor substrate 130. Specifically, the second conductivity-type impurities are introduced into a region surrounded by the separating layer 120 of the semiconductor substrate 130, and thereafter heat treatment is performed to activate the introduced second conductivity-type impurities, thereby forming the second conductivity-type layer 115. Further, the heat treatment causes solid-state diffusion of the first conductivity-type impurities included in the diffusion layer 123, thereby forming the first conductivity-type layer 111. This makes it possible to form a stacking structure of the first conductivity-type layer 111, the intermediate layer 113, and the second conductivity-type layer 115. Further, the field-effect transistor 145 is formed by a heretofore known method in a region surrounded by the element separating layer 121 of the semiconductor substrate 130. Thereafter, the interlayer insulating film 143 is formed using silicon oxide or the like on the one main surface of the semiconductor substrate 130 on which the second conductivity-type layer 115 and the field-effect transistor 145 are formed.

Subsequently, as illustrated in FIG. 7C, the multi-layer wiring layer 140 is formed on the semiconductor substrate 130. Specifically, the multi-layer wiring layer 140 is formed on the semiconductor substrate 130 by repeating film formation of the interlayer insulating film 143, formation of the wiring layer 142, and formation of the via 141 penetrating through the interlayer insulating film 143. For constituent materials of the interlayer insulating film 143, the wiring layer 142, and the via 141, the above-described materials are usable.

Next, as illustrated in FIG. 7D, the semiconductor substrate 130 on which the multi-layer wiring layer 140 is formed in the above-described process, and the semiconductor substrate 230 on which the multi-layer wiring layer 240 is formed in a similar process are bonded to each other with the insulating layer 151 interposed therebetween. Specifically, the semiconductor substrate 130 on which the multi-layer wiring layer 140 is formed, and the semiconductor substrate 230 on which the multi-layer wiring layer 240 is formed are bonded to each other to cause the multi-layer wiring layers 140 and 240 to be opposed to each other. At this time, the wiring layer 142 inside the multi-layer wiring layer 140 and the wiring layer 242 inside the multi-layer wiring layer 240 are electrically insulated from each other by providing the insulating layer 151 on a bonding surface of the multi-layer wiring layers 140 and 240. It is possible to form electrical coupling (not illustrated) between the wiring layer 142 inside the multi-layer wiring layer 140 and the wiring layer 242 inside the multi-layer wiring layer 240 by using a heretofore known method separately.

Thereafter, as illustrated in FIG. 7E, the semiconductor substrate 130 is reduced in thickness by polishing the semiconductor substrate 130 until the separating layer 120 is exposed. Specifically, the semiconductor substrate 130 is reduced in thickness within a range of several μm to several dozen μm (for example, 2 μm to 20 μm) by polishing a surface opposed to a surface, on which the multi-layer wiring layer 140 is provided, of the semiconductor substrate 130 until the separating layer 120 is exposed with use of CMP or the like. This makes it possible to form the semiconductor device 100 including the first conductivity-type layer 111, the intermediate layer 113, and the second conductivity-type layer 115 that are stacked, and the multi-layer semiconductor device that includes the semiconductor device 100.

4. ELECTRONIC APPARATUS

Next, description is given of an electronic apparatus according to an embodiment of the present disclosure. The electronic apparatus according to the embodiment of the present disclosure is any of a variety of electronic apparatuses in which circuits including the above-described semiconductor device 100 are mounted. Examples of the electronic apparatus according to the present embodiment are described with reference to FIGS. 8A, 8B, and 8C. Each of FIGS. 8A, 8B, and 8C is an are external views of an example of the electronic apparatus according to the present embodiment.

For example, the electronic apparatus according to the present embodiment may be an electronic apparatus such as a smartphone. Specifically, as illustrated in FIG. 8A, a smartphone 900 includes a display section 901 that displays various types of information, and an operating section 903 including a button or the like for receiving an input from a user. Here, the semiconductor device 100 according to the embodiment of the present disclosure may be provided in a control circuit that controls various operations of the smartphone 900.

For example, the electronic apparatus according to the present embodiment may be an electronic apparatus such as a digital camera. Specifically, as illustrated in FIGS. 8B and 8C, a digital camera 910 includes a main body section (a camera body) 911, an interchangeable lens unit 913, a grip 915 to be gripped by the user at the time of photographing, a monitor section 917 that displays various types of information, and an EVF (Electronic View Finder) 919 that displays a through image viewed by the user at the time of photographing. It is to be noted that FIG. 8B is an external view of the digital camera 910 as seen from the front side (i.e., a subject side), and FIG. 8C is an external view of the digital camera 910 as seen from the back side (i.e., a photographer side). Here, the semiconductor device 100 according to the embodiment of the present disclosure may be provided in a control circuit that controls various operations of the digital camera 910.

It is to be noted that the electronic apparatus according to the present embodiment is not limited to the above-described examples. The electronic apparatus according to the present embodiment may be any of electronic apparatuses in every field. As examples of such electronic apparatuses, it is possible to exemplify a glass-shaped wearable device, an HMD (Head-Mounted Display), a television apparatus, an electronic book, a PDA (Personal Digital Assistant), a notebook personal computer, a video camera, a gaming console, or the like.

In particular, the semiconductor device 100 according to the embodiment of the present disclosure functions as a withstand voltage element that withstands a higher voltage. Therefore, the semiconductor device 100 according to the embodiment of the present disclosure is more suitably usable in electronic apparatuses in an in-vehicle mounting field or an IoT field in which a higher-voltage power supply is used in an internal circuit.

5. CONCLUSION

As described above, according to the semiconductor device 100 of the embodiment of the present disclosure, it is possible to form the PIN structure that includes the first conductivity-type layer 111, the intermediate layer 113, and the second conductivity-type layer 115 in the stacking direction. This allows the semiconductor device 100 according to the present embodiment to further reduce an occupancy area in a planar direction, as compared with a case where the PIN structure is formed in the planar direction. Therefore, the semiconductor device 100 according to the present embodiment makes it possible to provide a withstand voltage element that withstands a higher voltage while having a more efficient occupancy area.

A preferred embodiment(s) of the present disclosure has/have been described above in detail with reference to the accompanying drawings, but the technical scope of the present disclosure is not limited to such an embodiment(s). It is apparent that a person having ordinary skill in the art of the present disclosure may arrive at various alterations and modifications within the scope of the technical idea described in the appended claims, and it is understood that such alterations and modifications naturally fall within the technical scope of the present disclosure.

For example, in the above-described embodiment, an example in which the semiconductor device 100 according to the present embodiment is applied to a solid-state imaging device is described, but the present technology is not limited to such an example. The semiconductor device 100 according to the present embodiment may be applied to a logic circuit, a memory device, various sensors, and the like.

Furthermore, the effects described herein are merely illustrative and exemplary, and not limitative. That is, the technology according to the present disclosure may exert other effects that are apparent to those skilled in the art from the description herein, in addition to the above-described effects or in place of the above-described effects.

It is to be noted that the following configurations also fall within the technical scope of the present disclosure.

(1)

A semiconductor device including:

a first conductivity-type layer into which first conductivity-type impurities are introduced;

a second conductivity-type layer into which second conductivity-type impurities are introduced, the second conductivity-type impurities being different in polarity from the first conductivity-type impurities; and an intermediate layer that is sandwiched between the first conductivity-type layer and the second conductivity-type layer, and does not include the first conductivity-type impurities or the second conductivity-type impurities, or includes the first conductivity-type impurities or the second conductivity-type impurities at a concentration lower than a concentration of the first conductivity-type impurities in the first conductivity-type layer or the second conductivity-type impurities in the second conductivity-type layer, the first conductivity-type layer, the intermediate layer, and the second conductivity-type layer being stacked in a thickness direction of a semiconductor substrate inside the semiconductor substrate.

(2)

The semiconductor device according to (1), further including a separating layer that is provided between each of the first conductivity-type layer, the intermediate layer, and the second conductivity-type layer and the semiconductor substrate, and isolates the first conductivity-type layer, the intermediate layer, and the second conductivity-type layer from the semiconductor substrate.

(3)

The semiconductor device according to (2), in which a cross-sectional shape of the separating layer in the thickness direction of the semiconductor substrate is tapered.

(4)

The semiconductor device according to any one of (1) to (3), in which a stacking body of the first conductivity-type layer, the intermediate layer, and the second conductivity-type layer is provided to penetrate through the semiconductor substrate in the thickness direction.

(5)

The semiconductor device according to (4), in which the first conductivity-type layer and the second conductivity-type layer are exposed on both respective main surfaces opposed to each other of the semiconductor substrate.

(6)

The semiconductor device according to (4), in which at least one of the first conductivity-type layer or the second conductivity-type layer is exposed by an opening provided in the semiconductor substrate.

(7)

The semiconductor device according to any one of (1) to (6), in which the intermediate layer includes the first conductivity-type impurities or the second conductivity-type impurities at a concentration lower than the concentration of the first conductivity-type impurities in the first conductivity-type layer or the second conductivity-type impurities in the second conductivity-type layer.

(8)

The semiconductor device according to any one of (1) to (7), in which the first conductivity-type layer or the second conductivity-type layer is electrically coupled to a via provided in a multi-layer wiring layer that is formed on one of main surfaces of the semiconductor substrate.

(9)

An electronic apparatus provided with a semiconductor device that is provided inside a semiconductor substrate, the semiconductor device including:

a first conductivity-type layer into which first conductivity-type impurities are introduced;
a second conductivity-type layer into which second conductivity-type impurities are introduced, the second conductivity-type impurities being different in polarity from the first conductivity-type impurities; and
an intermediate layer that is sandwiched between the first conductivity-type layer and the second conductivity-type layer, and does not include the first conductivity-type impurities or the second conductivity-type impurities, or includes the first conductivity-type impurities or the second conductivity-type impurities at a concentration lower than a concentration of the first conductivity-type impurities in the first conductivity-type layer or the second conductivity-type impurities in the second conductivity-type layer,
the first conductivity-type layer, the intermediate layer, and the second conductivity-type layer being stacked in a thickness direction of a semiconductor substrate inside the semiconductor substrate.

REFERENCE NUMERAL LIST 11, 12, 13: single-layer semiconductor device
21, 31, 32: multi-layer semiconductor device
100: semiconductor device
111: first conductivity-type layer
113: intermediate layer
115: second conductivity-type layer
120: separating layer
121, 221: element separating layer
130, 230, 330: semiconductor substrate
140, 240, 340: multi-layer wiring layer
141, 241: via
142, 242: wiring layer
143, 243: interlayer insulating film
145, 245, 345: field-effect transistor
510: insulating layer
520: microlens
531: opening
533: pad
551, 551A, 551B: twin contact
552: electrode junction structure

The invention claimed is:
1. A semiconductor device, comprising:
a first conductivity-type layer that comprises first conductivity-type impurities;
a second conductivity-type layer that comprises second conductivity-type impurities, wherein the second conductivity-type impurities are different in polarity from the first conductivity-type impurities;
an intermediate layer sandwiched between the first conductivity-type layer and the second conductivity-type layer, wherein
the intermediate layer does not include the first conductivity-type impurities or the second conductivity-type impurities, or includes one of the first conductivity-type impurities or the second conductivity-type impurities at a concentration lower than a concentration of one of the first conductivity-type impurities in the first conductivity-type layer or the second conductivity-type impurities in the second conductivity-type layer, and
the first conductivity-type layer, the intermediate layer, and the second conductivity-type layer are stacked in a thickness direction of a semiconductor substrate inside the semiconductor substrate; and a separating layer between each of the first conductivity-type layer, the intermediate layer, and the second conductivity-type layer and the semiconductor substrate, wherein the separating layer isolates each of the first conductivity-type layer, the intermediate layer, and the second conductivity-type layer from the semiconductor substrate, wherein
a stacking body of the first conductivity-type layer, the intermediate layer, and the second conductivity-type layer penetrates through the semiconductor substrate in the thickness direction of the semiconductor substrate,
the first conductivity-type layer is exposed on a first main surface of the semiconductor substrate,
the second conductivity-type layer is exposed on a second main surface of the semiconductor substrate, and
the first main surface is opposite to the second main surface.

2. The semiconductor device according to claim 1, wherein a cross-sectional shape of the separating layer in the thickness direction of the semiconductor substrate is tapered.

3. The semiconductor device according to claim 1, wherein at least one of the first conductivity-type layer or the second conductivity-type layer is exposed by an opening in the semiconductor substrate.

4. The semiconductor device according to claim 1, wherein the intermediate layer includes one of the first conductivity-type impurities or the second conductivity-type impurities at the concentration lower than the concentration of one of the first conductivity-type impurities in the first conductivity-type layer or the second conductivity-type impurities in the second conductivity-type layer.

5. The semiconductor device according to claim 1, wherein one of the first conductivity-type layer or the second conductivity-type layer is electrically coupled to a via in a multi-layer wiring layer on a main surface of a plurality of main surfaces of the semiconductor substrate.

6. An electronic apparatus, comprising:
a semiconductor device inside a semiconductor substrate, wherein the semiconductor device comprises:
a first conductivity-type layer that comprises first conductivity-type impurities;
a second conductivity-type layer that comprises second conductivity-type impurities, wherein the second conductivity-type impurities are different in polarity from the first conductivity-type impurities;
an intermediate layer sandwiched between the first conductivity-type layer and the second conductivity-type layer, wherein
the intermediate layer does not include the first conductivity-type impurities or the second conductivity-type impurities, or includes one of the first conductivity-type impurities or the second conductivity-type impurities at a concentration lower than a concentration of one of the first conductivity-type impurities in the first conductivity-type layer or the second conductivity-type impurities in the second conductivity-type layer, and
the first conductivity-type layer, the intermediate layer, and the second conductivity-type layer are stacked in a thickness direction of a semiconductor substrate inside the semiconductor substrate; and a separating layer between each of the first conductivity-type layer, the intermediate layer, and the second conductivity-type layer and the semiconductor substrate, wherein the separating layer isolates each of the first conductivity-type layer, the intermediate layer, and the second conductivity-type layer from the semiconductor substrate, wherein a stacking body of the first conductivity-type layer, the intermediate layer, and the second conductivity-type layer penetrates through the semiconductor substrate in the thickness direction of the semiconductor substrate, the first conductivity-type layer is exposed on a first main surface of the semiconductor substrate, the second conductivity-type layer is exposed on a second main surface of the semiconductor substrate, and the first main surface is opposite to the second main surface.

\* \* \* \* \*